United States Patent
Tange et al.

(10) Patent No.: US 12,272,638 B2
(45) Date of Patent: Apr. 8, 2025

(54) INTEGRATED TRANSFORMER MODULE

(71) Applicant: Murata Manufacturing Co., Ltd., Nagaokakyo (JP)

(72) Inventors: Takayuki Tange, Milton Keynes (GB); Yoshimitsu Ushimi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 433 days.

(21) Appl. No.: 17/641,000

(22) PCT Filed: Oct. 7, 2020

(86) PCT No.: PCT/US2020/054514
§ 371 (c)(1),
(2) Date: Mar. 7, 2022

(87) PCT Pub. No.: WO2021/071900
PCT Pub. Date: Apr. 15, 2021

(65) Prior Publication Data
US 2022/0344260 A1    Oct. 27, 2022

Related U.S. Application Data

(60) Provisional application No. 62/912,247, filed on Oct. 8, 2019.

(51) Int. Cl.
*H01L 23/52* (2006.01)
*H01F 27/28* (2006.01)
(Continued)

(52) U.S. Cl.
CPC ..... *H01L 23/5227* (2013.01); *H01F 27/2804* (2013.01); *H01F 27/40* (2013.01);
(Continued)

(58) Field of Classification Search
CPC . H01L 27/5227; H01L 27/2804; H01L 27/40; H01L 24/02
(Continued)

(56) References Cited

U.S. PATENT DOCUMENTS 5,500,542 A * 3/1996 Iida .................. H01L 27/11803
257/210
7,531,893 B2   5/2009 Koduri
(Continued)

FOREIGN PATENT DOCUMENTS

CN    101454848 A    6/2009
TW    201539589 A *  10/2015 ....... H01L 21/31053

OTHER PUBLICATIONS

Official Communication issued in International Patent Application No. PCT/US2020/054514, mailed on Jan. 29, 2021.

*Primary Examiner* — Phuc T Dang
(74) *Attorney, Agent, or Firm* — Keating & Bennett, LLP

(57) ABSTRACT

A module includes a substrate, metal layers and insulating layers laminated on the substrate, a bottom winding made of a metal directly contacting a first metal layer or a second metal layer, a first insulating layer on the bottom winding, a core on the first insulating layer, a second insulating layer on the core, a top winding made of the metal that is located on the core and a portion of the second insulating layer and that directly contacts the first metal layer or the second metal layer, and a third insulating layer on the top winding, electronic components that are located on the third insulating layer, where primary and secondary windings of the transformer are defined by portions of the bottom winding and the top winding and are located on opposite sides of the core from each other.

10 Claims, 19 Drawing Sheets

(51) Int. Cl.
*H01F 27/40* (2006.01)
*H01F 41/04* (2006.01)
*H01L 23/522* (2006.01)
*H01L 25/16* (2023.01)
*H10D 1/20* (2025.01)
*H01L 23/00* (2006.01)

(52) U.S. Cl.
CPC ........... H01F 41/041 (2013.01); H01L 25/16 (2013.01); H10D 1/20 (2025.01); *H01L 24/02* (2013.01); *H01L 24/05* (2013.01); *H01L 24/16* (2013.01); *H01L 24/48* (2013.01); *H01L 2224/02313* (2013.01); *H01L 2224/02331* (2013.01); *H01L 2224/02381* (2013.01); *H01L 2224/05569* (2013.01); *H01L 2224/16245* (2013.01); *H01L 2224/48245* (2013.01)

(58) Field of Classification Search
USPC .......................................................... 257/531
See application file for complete search history.

(56) References Cited

U.S. PATENT DOCUMENTS

| | | | |
|---|---|---|---|
| 7,884,452 | B2 | 2/2011 | Feng et al. |
| 9,451,701 | B2 | 9/2016 | Chen et al. |
| 10,115,671 | B2 | 10/2018 | Shenoy et al. |
| 10,244,633 | B2 | 3/2019 | Sturcken et al. |
| 2009/0072923 | A1 | 3/2009 | Ishida |
| 2011/0279214 | A1 | 11/2011 | Lee et al. |
| 2013/0049730 | A1 | 2/2013 | Kato |
| 2014/0225700 | A1* | 8/2014 | Doyle ..................... H01L 28/10 336/200 |
| 2015/0043171 | A1 | 2/2015 | Mugiya et al. |
| 2018/0097055 | A1 | 4/2018 | Pizzi et al. |
| 2018/0139846 | A1* | 5/2018 | Sturcken ................. H01F 41/02 |
| 2018/0374785 | A1* | 12/2018 | Chang ..................... H01L 21/561 |
| 2019/0035714 | A1* | 1/2019 | Yang ..................... H01L 21/4825 |
| 2019/0043846 | A1 | 2/2019 | Lin et al. |
| 2019/0122931 | A1* | 4/2019 | Huang .................... H01L 24/80 |
| 2019/0123019 | A1 | 4/2019 | Yu et al. |
| 2019/0131273 | A1* | 5/2019 | Chen ....................... H01L 24/19 |
| 2019/0182957 | A1 | 6/2019 | Sturcken et al. |

* cited by examiner

INTEGRATED TRANSFORMER MODULE

BACKGROUND OF THE INVENTION

1. Field of the Invention

The present invention relates to transformers. More specifically, the present invention relates to an integrated transformer module that can be used in DC-DC converter or power supply applications.

2. Description of the Related Art

Conventional power supplies and DC-DC converters require large discrete magnetic components such as transformers and inductors that have inherent losses, generate heat, emit electromagnetic interference (EMI), and are costly to fabricate. Battery-operated, mobile, and handheld applications require small, efficient, and cost-effective components.

Therefore, smaller magnetic components and transformers have been developed that are fabricated directly on substrates such as printed circuit boards (PCBs) or silicon substrates. Components like planar inductors have been fabricated on a surface of silicon substrates as a semiconductor chip. These components have been made similar to integrated circuits (IC) using semiconductor manufacturing techniques. However, as shown, for example, in U.S. Pat. No. 10,244,633, in a power-management control IC with passive components, transformer windings defined by metal layers on silicon do not provide adequate isolation in isolated DC-DC converters because of the small clearance between high-voltage components.

Also, circuit components and a transformer can be built on the same silicon die, but if a capacitor with a high capacitance value, such as a ceramic capacitor, is required, then these components will not fit on the same silicon die. Therefore, large electronic components need to be located on a substrate separate from the silicon die and connected by copper traces that take up space.

SUMMARY OF THE INVENTION

To overcome the problems described above, preferred embodiments of the present invention provide circuitry modules each including a transformer integrated into a substrate that can be connected to other components on the same substrate and that can be used in high current DC-DC converter applications.

According to a preferred embodiment of the present invention, transformers in a module are fabricated using plated metal layers on a substrate. A module including a transformer with a core can be made by (1) a plating process that is different from conventional transformer-on-substrate processes, (2) connecting the transformer to electronic components on and/or in the substrate, and (3) overmolding the electronic components with an insulating molding material. Overmolding the transformer and the electronic components provides environmental protection and electrical isolation, allowing the module to be smaller than unmolded modules. Furthermore, circuitry on the primary side and circuitry on the secondary side of the transformer that coexist on the silicon substrate are electrically isolated from each other by a PN junction, which allows the distance between each circuit side to be reduced or minimized.

According to a preferred embodiment of the present invention, a transformer module includes a substrate, a plurality of metal layers and a plurality of insulating layers laminated on the substrate, first and second bottom windings of a transformer made of a metal, the first bottom winding directly contacts a first metal layer of the plurality of metal layers, and the second bottom winding directly contacts a second metal layer of the plurality of metal layers, a first insulating layer of the plurality of insulating layers on the first and second bottom windings, a core on the first insulating layer, a second insulating layer of the plurality of insulating layers on the core, first and second top windings of the transformer made of the metal that is located on the core and a portion of the second insulating layer, the first top winding directly contacts the first metal layer of the plurality of metal layers, and the second top winding directly contacts the second metal layer of the plurality of metal layers, a third insulating layer of the plurality of insulating layers on the first and second top windings, electronic components that are located on the third insulating layer and that are connected to the transformer, and a molding material on the electronic components. The first bottom winding and the first top winding are included in a primary winding of the transformer, and the second bottom winding and the second top winding are included in a secondary winding of the transformer, and the primary and secondary windings of the transformer are not electrically connected to each other.

The substrate can include silicon. The transformer module can further include circuitry on the substrate, where the transformer can be on a same side of the substrate on which the circuitry is located. The transformer module can further include a PN junction in the substrate that isolates a primary side and a secondary side of the transformer. The transformer module can further include input-output pads that are on an opposite side of the substrate than a side of the substrate on which the transformer is located. The top winding can extend above a surface on which the electronic components are mounted. The metal can be copper.

According to a preferred embodiment of the present invention, a method of manufacturing a transformer module includes providing a substrate; forming a plurality of metal layers on the substrate; depositing a metal to form first and second bottom windings of a transformer, the first bottom winding directly contacts a first metal layer of the plurality of metal layers, and the second bottom winding directly contacts a second metal layer of the plurality of metal layers; forming a first insulating layer on the first and second bottom windings; electroplating a core on the first insulating layer; forming a second insulating layer on the core; depositing the metal to form first and second top windings of the transformer on the second insulating layer, the top first and second top windings extend around the core, the first top winding directly contacts the first metal layer of the plurality of metal layers, and the second top winding directly contacts the second metal layer of the plurality of metal layers; forming a third insulating layer on the first and second top windings; mounting electronic components on the third insulating layer such that the electronic components are connected to the transformer; and overmolding the electronic components with a molding material. The first bottom winding and the first top winding are included in a primary winding of the transformer, and the second bottom winding and the second top winding are included in a secondary winding of the transformer; and primary and secondary windings of the transformer are not electrically connected to each other.

The metal can be electro-plated copper.

According to a preferred embodiment of the present invention, a transformer module includes a silicon substrate, circuitry on a first side of the silicon substrate including input-output pads, a bottom winding of a metal of a transformer that is located on a second side of the silicon substrate and that contacts the circuitry through the silicon substrate, a first insulating layer on the bottom winding, a core on the first insulating layer, a second insulating layer on the core, a top winding of the metal of the transformer that extends around the core and a portion of the second insulating layer and that contacts the circuitry through the silicon substrate, a third insulating layer on the top winding, electronic components that are located on the third insulating layer and that are connected to the transformer, and a molding material on the electronic components. Primary and secondary windings of the transformer are defined by portions of the bottom winding and the top winding and are not electrically connected to each other.

The transformer module can further include a PN junction in the silicon substrate that isolates a primary side and a secondary side of the transformer. The metal can be copper.

According to a preferred embodiment of the present invention, a method of manufacturing a transformer module includes providing a silicon substrate; forming circuitry on a first side of the silicon substrate including input-output pads; depositing a metal on a second side of the silicon substrate to form a bottom winding of a transformer that contacts the circuitry; forming a first insulating layer on the bottom winding; electroplating a core on the first insulating layer; forming a second insulating layer on the core; depositing the metal to form a top winding of the transformer on the second insulating layer, the top winding extends around the core and contacts the circuitry through the silicon substrate; forming a third insulating layer on the top winding; mounting electronic components on the third insulating layer such that the electronic components are connected to the transformer; and overmolding the electronic components with a molding material. Primary and secondary windings of the transformer are defined by portions of the bottom winding and the top winding and are not electrically connected to each other.

The metal can be electro-plated copper.

According to a preferred embodiment of the present invention, a transformer module includes a silicon substrate; circuitry on a first side of the silicon substrate; a bottom winding of a metal of a transformer that is located on a second side of the silicon substrate and that is connected to the circuitry; a first insulating layer on the bottom winding; a core on the first insulating layer, a second insulating layer on the core; a top winding of the metal of the transformer that extends around the core and a portion of the second insulating layer and that is connected to the circuitry; a third insulating layer covering the top winding; a lead frame with input-output pads connected to the transformer; and a molding material covering the silicon substrate, the transformer, and the lead frame except the input-output pads. Primary and secondary windings of the transformer are defined by portions of the bottom winding and the top winding and are not electrically connected to each other.

The transformer module can further include a PN junction in the silicon substrate that isolates a primary side and a secondary side of the transformer. The transformer module can further include wires that connect the transformer to the lead frame. The metal can be electro-plated copper.

According to a preferred embodiment of the present invention, a circuit module includes a redistribution layer including a metal layer, an insulating layer, and a magnetic component that includes a first metal winding that extends around a core and that is connected to the metal layer; a substrate that is connected to a first side of the redistribution layer and that includes a first transistor and a second transistor; and an electronic component connected to a second side of the redistribution layer opposite to the first side. The first metal winding is thicker than the metal layer.

The substrate can include silicon and a PN junction between the first transistor and the second transistor. A portion of the first metal winding can extend beyond a surface of the redistribution layer. The substrate can include input-output pads that are on an opposite side of the substrate than a side of the substrate on which the redistribution layer is located. The circuit module can further include a lead frame connected to either the redistribution layer or the substrate. The circuit module can further include a wire, where the lead frame can be connected to the substrate and where the wire can be connected to the lead frame and the redistribution layer. The magnetic component can be a transformer and can further include a second metal winding that extends around the core. The first transistor can be connected to the first metal winding, and the second transistor can be connected to the second metal winding. The first metal winding and the second metal winding can be electrically isolated from each other. The magnetic component can be an inductor.

According to a preferred embodiment of the present invention, a transformer module includes a substrate; an insulating layer that is on the substrate and that includes a plurality of metal layers, a core, first and second bottom windings of a transformer made of a metal, the first bottom winding directly contacts a first metal layer of the plurality of metal layers, and the second bottom winding directly contacts a second metal layer of the plurality of metal layers, and first and second top windings of the transformer made of the metal that is located on the core, the first top winding directly contacts the first metal layer of the plurality of metal layers, and the second top winding directly contacts the second metal layer of the plurality of metal layers; electronic components that are located on the insulating layer and that are connected to the transformer; and a molding material on the electronic components. The first bottom winding and the first top winding are included in a primary winding of the transformer, the second bottom winding and the second top winding are included in a secondary winding of the transformer, and the primary and secondary windings of the transformer are not electrically connected to each other.

The substrate can include silicon. The transformer module can further include circuitry on the substrate, and the transformer can be on a same side of the substrate on which the circuitry is located. The transformer module can further include a PN junction in the substrate that isolates a primary side and a secondary side of the transformer. The transformer module can further include input-output pads that are on an opposite side of the substrate than a side of the substrate on which the transformer is located.

The plurality of top windings extends above a surface on which the electronic components are mounted. The metal can be copper.

According to a preferred embodiment of the present invention, a transformer module includes a silicon substrate; circuitry on a first side of the silicon substrate including input-output pads; an insulating layer that is on a second side of the silicon substrate and that includes a core, a bottom winding of a metal of a transformer that extends below the core and that contacts the circuitry through the silicon substrate, and a top winding of the metal of the transformer that extends around the core and that contacts the circuitry through the silicon substrate; electronic components that are located on the insulating substrate and that are connected to the transformer; and a molding material on the electronic components. Primary and secondary windings of the transformer are defined by portions of the bottom winding and the top winding and are not electrically connected to each other.

The transformer module can further include a PN junction in the silicon substrate that isolates a primary side and a secondary side of the transformer. The metal can be copper.

A transformer module includes a silicon substrate; circuitry on a first side of the silicon substrate; an insulating layer that is located on a second side of the silicon substrate and that includes: a core; a bottom winding of a metal of a transformer that extends below the core and that is connected to the circuitry; and a top winding of the metal of the transformer that extends around the core and that is connected to the circuitry; a lead frame with input-output pads connected to the transformer; and a molding material covering the silicon substrate, the transformer, and the lead frame except the input-output pads. Primary and secondary windings of the transformer are defined by portions of the bottom winding and the top winding and are not electrically connected to each other.

The transformer module can further include a PN junction in the silicon substrate that isolates a primary side and a secondary side of the transformer. The transformer module can further include wires that connect the transformer to the lead frame. The metal can be copper.

The above and other features, elements, characteristics, steps, and advantages of the present invention will become more apparent from the following detailed description of preferred embodiments of the present invention with reference to the attached drawings.

DETAILED DESCRIPTION OF PREFERRED EMBODIMENTS

A transformer integrated into a substrate allows the thickness of the metal of the windings to be increased compared to conventional transformers. Therefore, the transformer can transmit increased current, while maintaining a small physical size. Thus, such a transformer can be integrated with other electronic components and can be used in smaller-volume, higher-power circuits.

Figure 1:
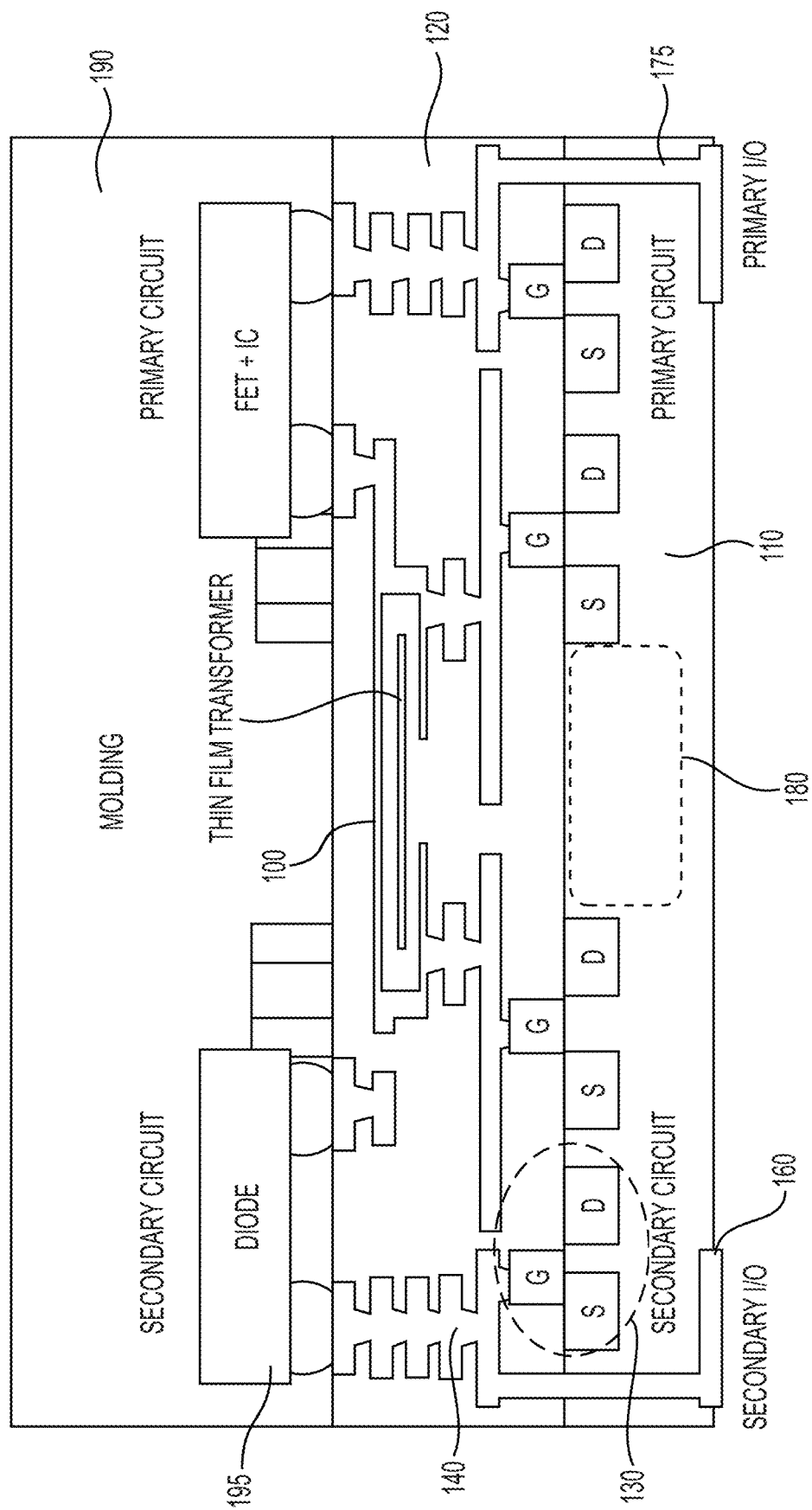
FIG. 1 shows an integrated-transformer circuit module according to a preferred embodiment of the present invention.

FIG. 1 shows a cross section of an integrated-transformer circuit module according to a preferred embodiment of the present invention. As shown, the circuit module can include a silicon substrate 110, a transformer 100 within a redistribution layer (RDL) that includes laminated metal layers 140 and insulating layers 120 on the silicon substrate 110, and circuitry on the RDL that is overmolded with a molding material 190.

FIG. 1 shows that a silicon substrate 110 can include doped areas defining sources S and drains D and a metal layer defining gates G of transistors 130 (within, for example, the dashed oval). The transistors 130 can be interconnected by the metal layers 140 within the insulating material 120. The metal layers 140 can be formed using typical semiconductor processing techniques. Although the substrate 110 is silicon, other materials are possible including ceramic, composite, a laminated printed circuit board (PCB), or another suitable material that may or may not include integrated circuitry and wiring.

The transformer 100 in FIG. 1 includes metal windings that wrap around a core and that are connected to the metal layers 140. The metal windings can be made from copper, aluminum, silver, gold, any other suitable metal, combination of metal layers, or an alloy. For example, the windings can be made of copper-plated metal. The metal windings of the transformer can be thicker than the metal layers 140, which allows the metal windings of the transformer to transmit higher current. For example, the thickness of the metal windings can be about 15 µm or more, within manufacturing tolerances, and the thickness of each metal layer 140 can be up to about 3 µm, within manufacturing tolerances. The core can be made of a cobalt alloy such as CoNiFe, CoFeSi, CoZrO, CoZrTa, made of a soft alloy such as Ni, Fe, NiFe, or can be made of any suitable magnetic material.

Although FIG. 1 shows a single cross section of the transformer 100, it should be understood that the metal windings of the transformer includes both a primary winding connected to the primary circuit and a secondary winding connected to the secondary circuit. Instead of the transformer 100, it is possible to use an inductor, in which there is only a single winding.

FIG. 1 shows that a PN junction 180 (within the dotted box) in the silicon substrate 110 is used to isolate the circuitry between the primary side and the secondary side of the transformer 100. For example, power transistors on the primary side can be defined by the transistors on the right side of FIG. 1, and synchronous rectifiers on the secondary side can be defined by the transistors on the left side of FIG. 1.

Larger electronic components 195 such as ceramic capacitors, diodes, MOSFETS, circuits on chips, etc. can be located on the RDL. The electronic components 195 can be overmolded with a dielectric molding material 190, such as a resin, to electrically isolate and to environmentally and physically protect the electrical components 195. Input-output I/O pads 160 used to electrically interconnect the circuit module to power, control signals, external circuitry, etc. can be located on a side of the silicon substrate 110 opposite to the RDL and can be connected to the RDL with through-silicon vias (TSVs) 175, although other interface features and techniques are possible.

FIGS. 2-25 show successive processing steps that can be used in fabricating the circuit module shown in FIG. 1. A description of features previously described with respect to FIG. 1 may be omitted for brevity.

Figure 2:
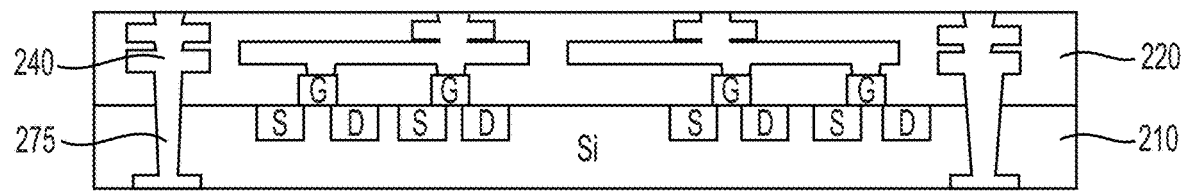
FIGS. 2-25 show processing steps included in fabricating the transformer circuit module shown in FIG. 1.
Figure 3:
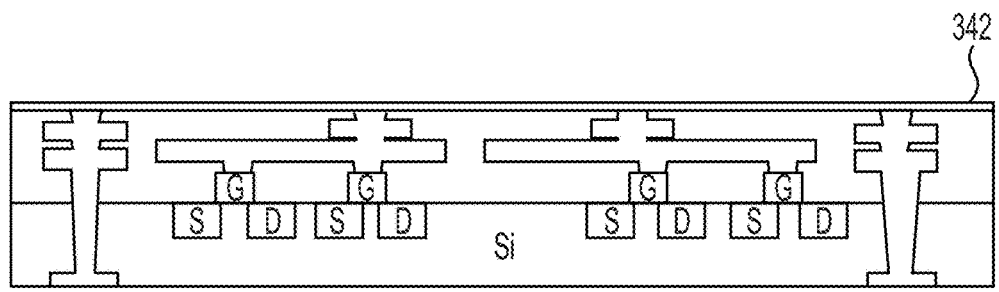
Figure 4:
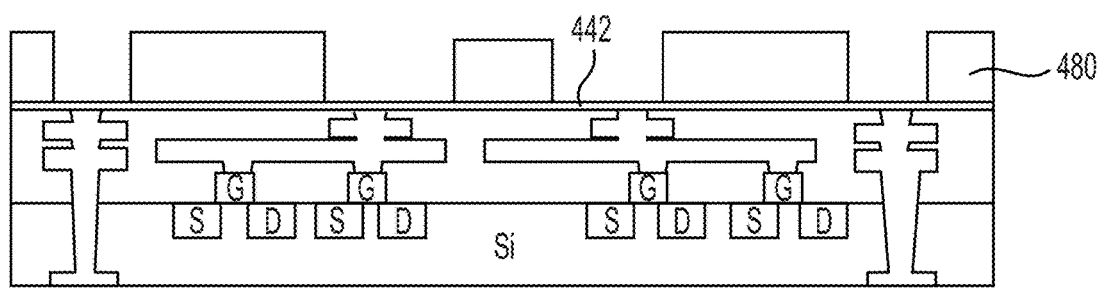

FIG. 2 shows the RDL including laminated insulating layers 220 and metal layers 240, and a TSV 275 formed in and through a silicon substrate 210 using conventional semiconductor processing techniques. If the substrate 210 is not silicon, through holes can be filled with conductive material by plating, screen printing, or any other suitable process. FIG. 3 shows a first seed metal 342 formed on the RDL. For example, the seed metal can be Ni, Cr, Au, Cu, or any other suitable material that can be deposited or electroplated on top of the RDL. FIG. 4 shows a patterned resist film 480 provided to cover portions of the first seed metal 442 and to expose other portions of the first seed metal 442.

Figure 5:
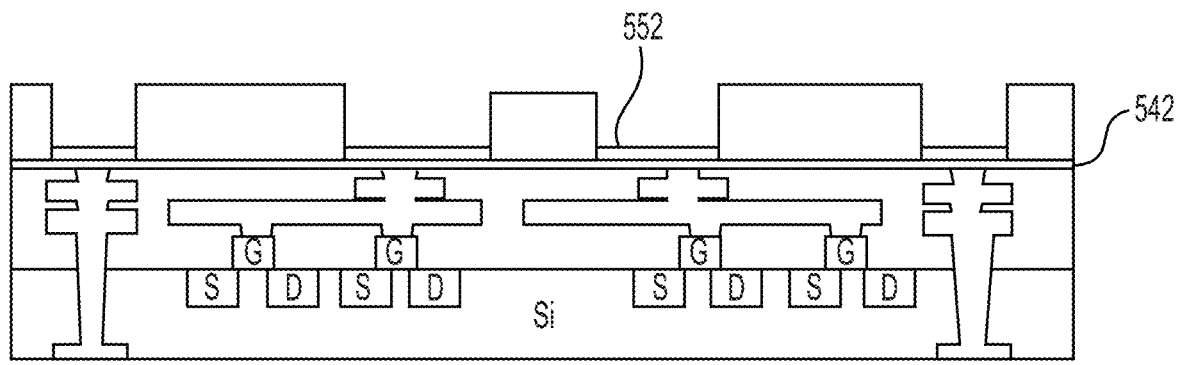
Figure 6:
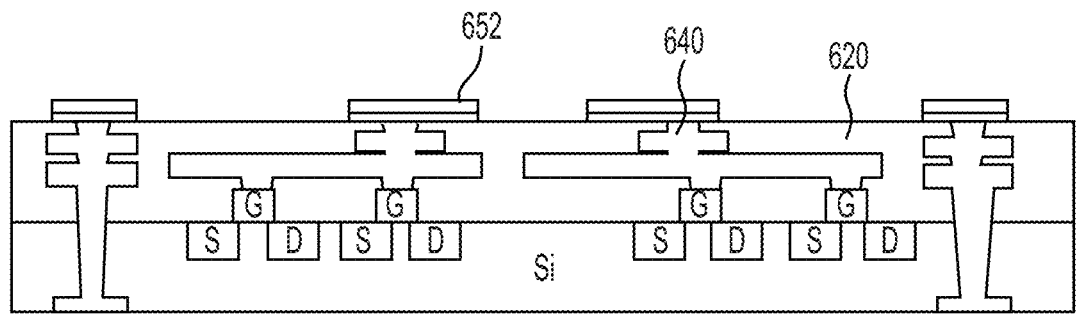
Figure 7:
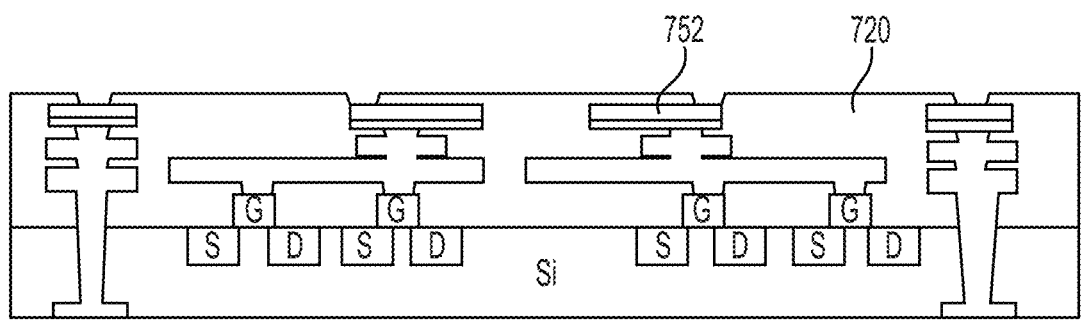

FIG. 5 shows that a bottom winding 552 of the transformer is formed by electrolytic plating of copper onto the exposed portions of the first seed metal 542. Although FIG. 5 shows a single cross section, it should be understood that multiple, electrically isolated bottom windings are formed. The bottom windings can be formed in a single step or multiple steps. In a transformer, some of the bottom windings define a portion of the primary winding, and some of the bottom windings define a portion of the secondary winding. In an inductor, the bottom windings define a portion of the inductor winding. In the step shown by FIG. 6, the resist film is stripped, and the first seed metal is etched, leaving the bottom winding 652. The portion of the winding of the transformer or inductor that is defined by the bottom winding 652 and the remaining portion of the first seed metal is in direct contact with the top metal layer 640 and the top insulating layer 620. FIG. 7 shows that an insulating layer 720 is formed on and around the bottom winding 752.

Figure 48:
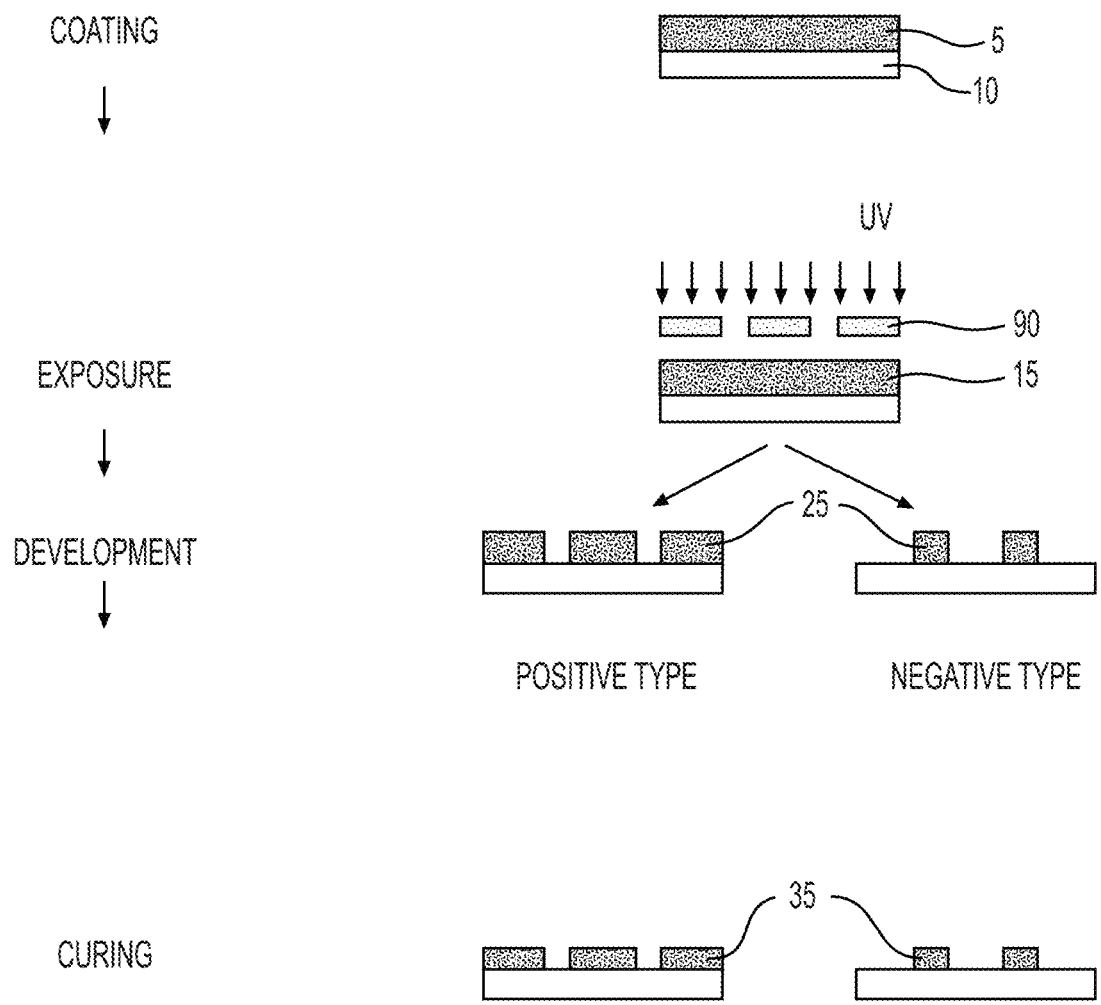
FIG. 48 shows a process for fabricating a photosensitive polyimide as an insulating layer.

FIG. 48 shows a process for fabricating a photosensitive polyimide (PSPI) as an insulating layer. FIG. 48 shows that the insulating layer 720 is formed by (1) coating an uncured positive or negative type PSPI 5 on a substrate 10, (2) patterning the coated uncured PSPI 15 by ultraviolet (UV) radiation through a mask 90, (3) developing the radiated, coated, uncured PSPI 25, resulting in a patterned positive or negative image of the mask 90, an and (4) curing the patterned PSPI 35 by heat treatment to leave portions of the bottom winding 752 exposed. The insulating layer 720 can be a polyimide, Su-8, Novolac resist, or any other suitable material.

Figure 8:
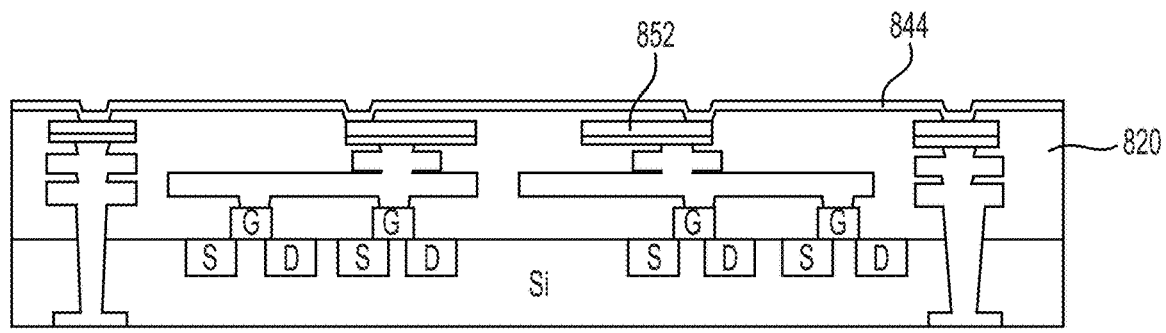
Figure 9:
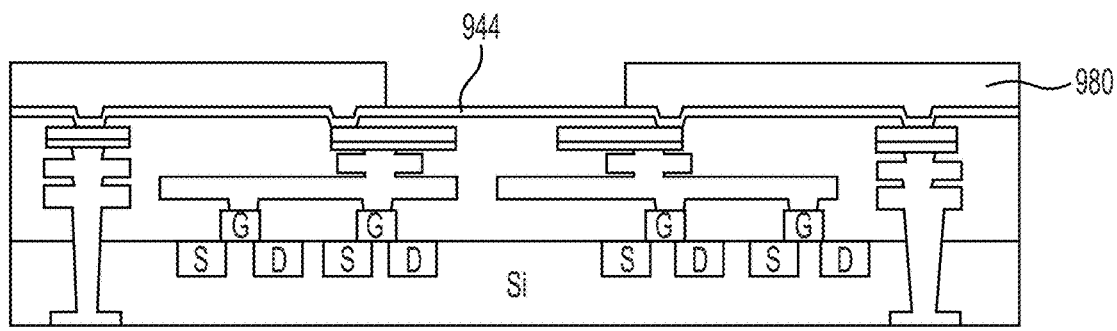
Figure 10:
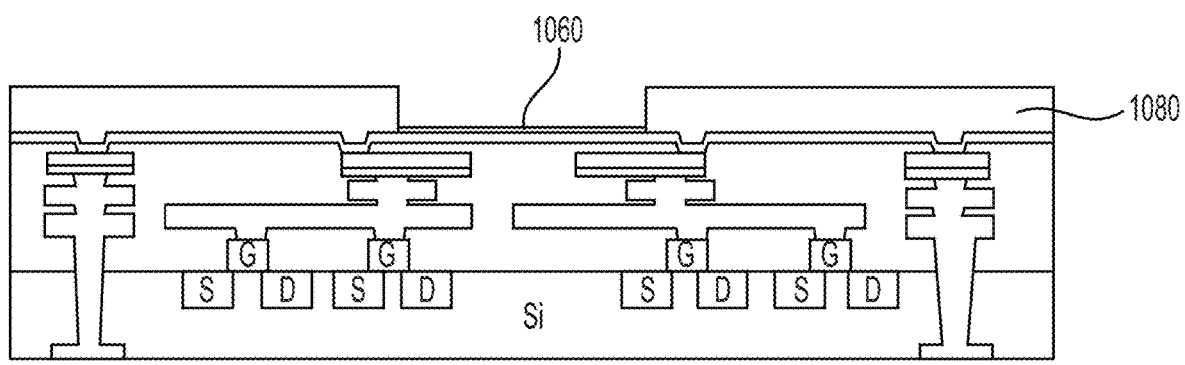

FIG. 8 shows that a second seed metal 844 is formed on top of the insulating layer 820 and contacting the previously exposed portions of the bottom winding 852. FIG. 9 shows that a patterned resist film 980 is formed on top of the second seed metal 944, exposing a portion of the second seed metal 944. FIG. 10 shows that a magnetic core 1060 is formed by electroplating any of the materials previously described on the portion of the second seed metal that is exposed by the resist film 1080.

Figure 11:
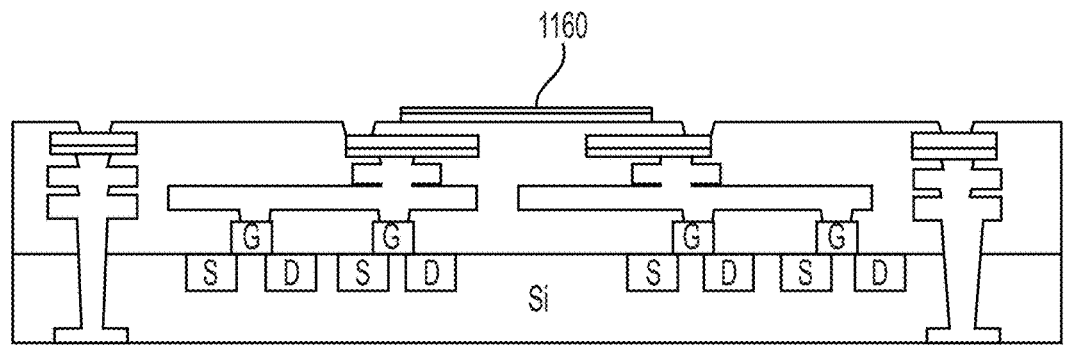
Figure 12:
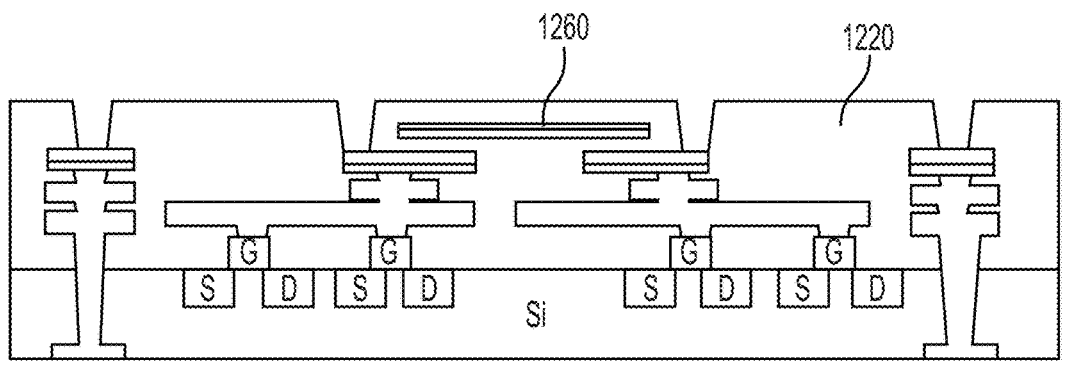
Figure 13:
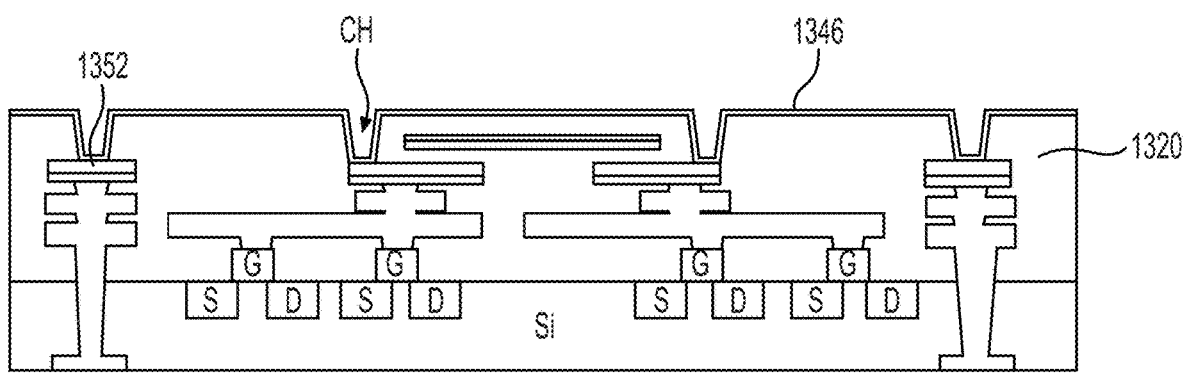

In the step shown by FIG. 11, the resist film is stripped, and the exposed second seed metal is etched away, exposing the magnetic core 1160. FIG. 12 shows that an insulating layer 1220 is formed on and around the magnetic core 1260 by the process previously described with respect to FIG. 48. FIG. 13 shows that a third seed metal 1346 is formed on top of the insulating layer 1320 and contacting exposed portions of the bottom winding 1352 in contact holes CH.

Figure 14:
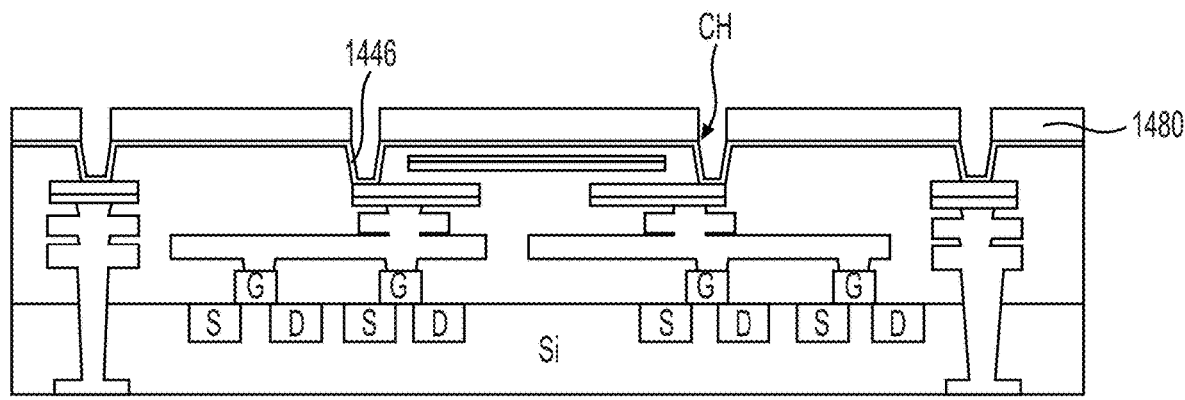
Figure 15:
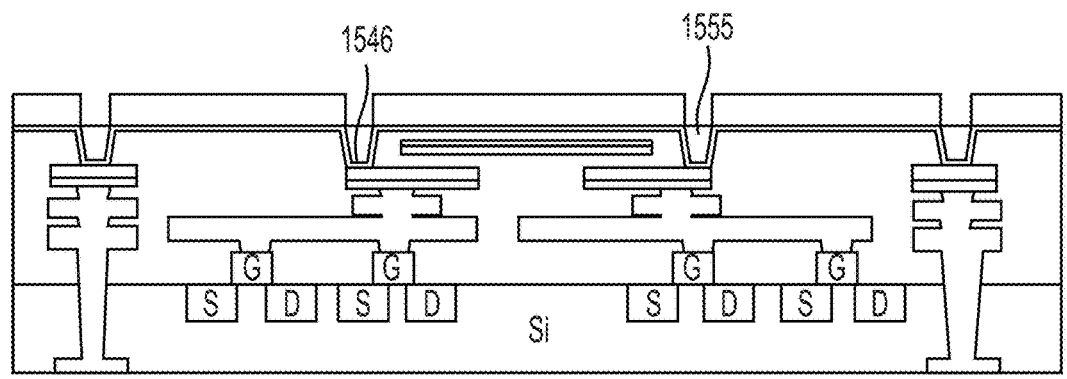
Figure 16:
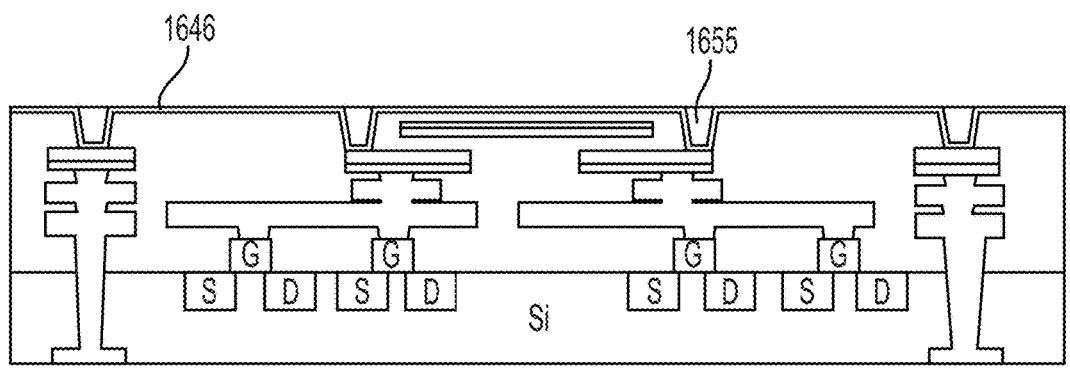

FIG. 14 shows that a patterned resist film 1480 is formed on top of the third seed metal 1446, exposing portions of the third seed metal 1446 in contact holes CH. FIG. 15 shows that winding connections 1555 of the transformer are formed by electrolytically plating copper onto the exposed portions of the third seed metal 1546. In the step shown by FIG. 16, the resist film is stripped, exposing the third seed metal 1646 and the winding connections 1655.

Figure 17:
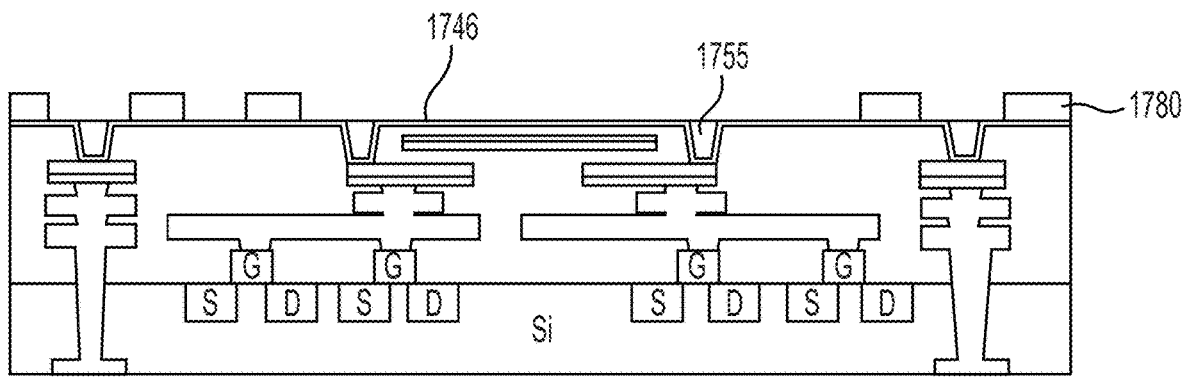

FIG. 17 shows that a patterned resist film 1780 is formed on top of the third seed metal 1746, exposing a portion of the third seed metal 1746 and the winding connections 1755.

Figure 18:
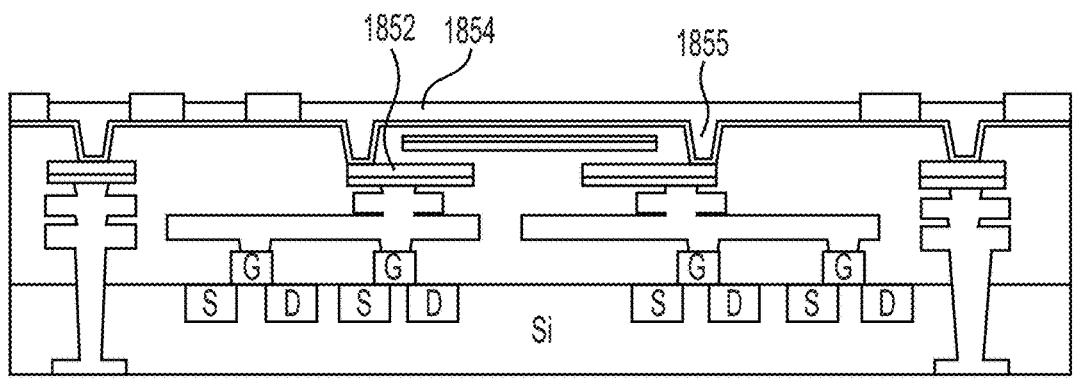
Figure 19:
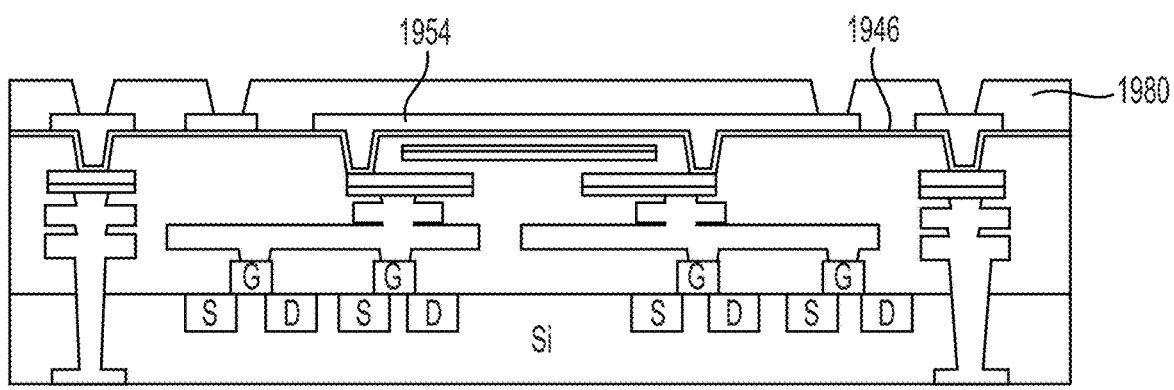

FIG. 18 shows that a top winding 1854 of the transformer is formed by electrolytically plating copper onto the exposed portions of the third seed metal and the winding connections 1855, thus making electrical connection to the bottom winding 1852. Although FIG. 18 shows a single cross section, it should be understood that the top winding 1854 is connected to different bottom windings. Multiple top windings can be formed in a single step or in multiple steps. In a transformer, some of the top windings define a portion of the primary winding, and some of the top windings define a portion of the secondary winding. In an inductor, the top windings define a portion of the inductor winding. FIG. 19 shows that a patterned resist film 1980 is formed on top of the top winding 1954 and portions of the third seed metal 1946, exposing portions of the top winding 1954.

Figure 20:
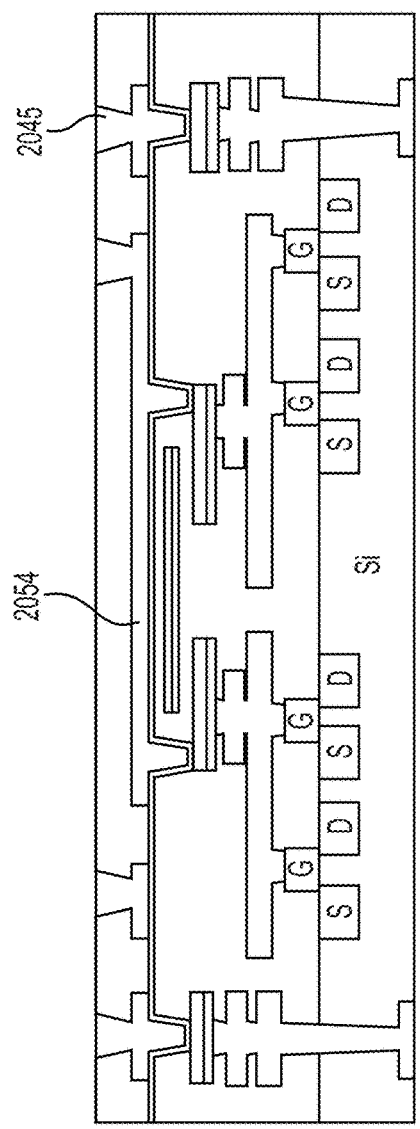
Figure 21:
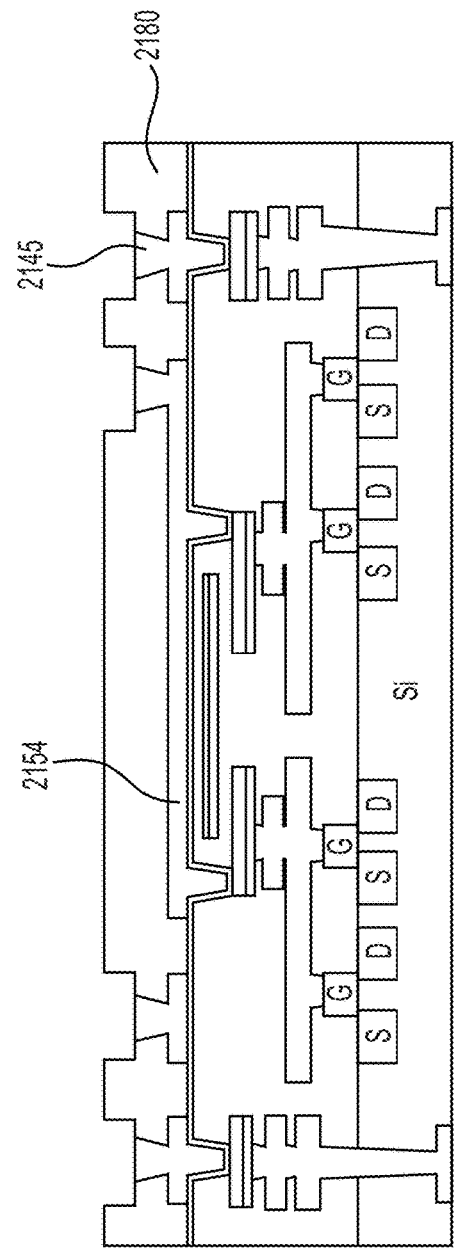

FIG. 20 shows that an RDL connection layer 2045 is formed by electrolytically plating copper onto the exposed portions of the top winding 2054. FIG. 21 shows that a patterned resist film 2180 is formed on top of the top winding 2154, exposing the RDL connection layer 2145.

Figure 22:
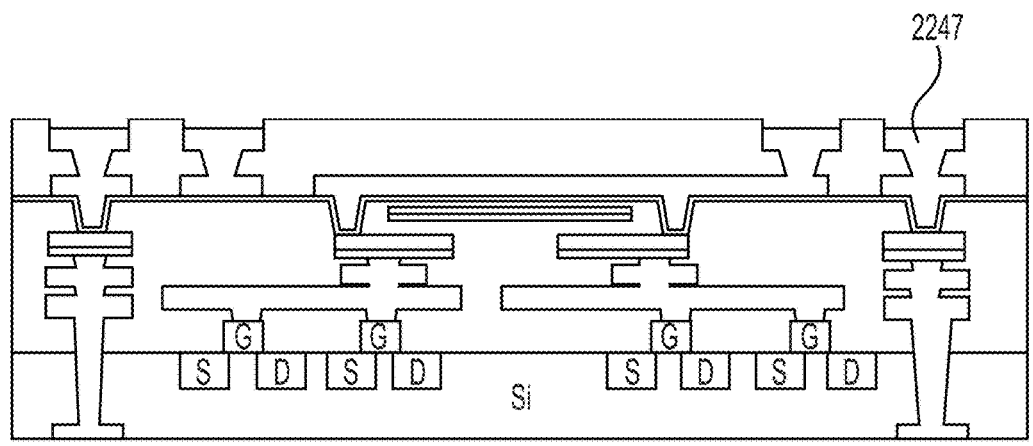
Figure 23:
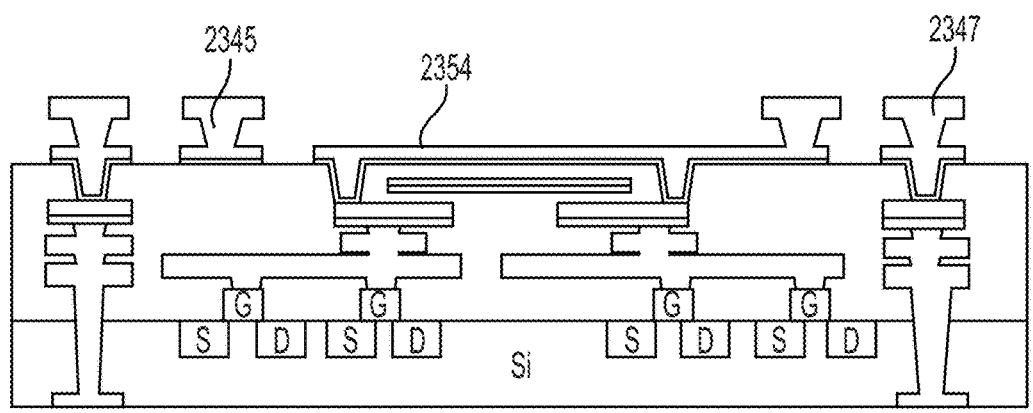
Figure 24:
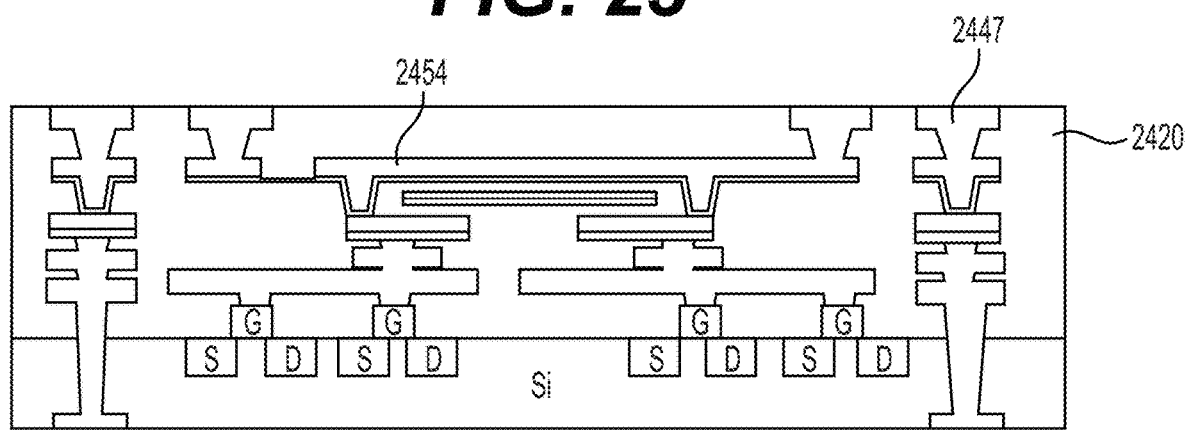

FIG. 22 shows that an RDL connection pad 2247 is formed by electrolytically plating copper onto the exposed portions of the RDL connection layer. In the step shown by FIG. 23, the resist film is stripped, and the exposed third seed metal is etched away, exposing the top winding 2354, the RDL connection layer 2345, and the RDL connection pad 2347. FIG. 24 shows that an insulating layer 2420 is formed on and around the top winding, the RDL connection layer, and the RDL connection pad 2447, exposing the RDL connection pad 2447 using the process previously described with respect to FIG. 48. The entire top winding 2454 is covered by the insulating layer 2420, improving the isolation of the circuit module.

Figure 25:
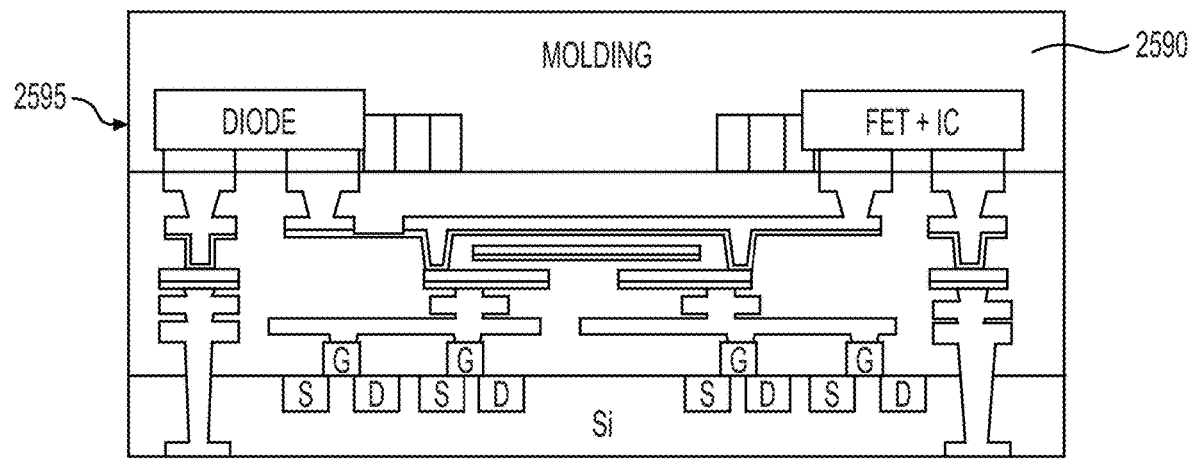

FIG. 25 shows that the circuitry and the transformer are integrated into the silicon substrate in which electronic components 2595 are connected to the RDL layer and then overmolded with a molding material 2590, such as a Novolac resin, to complete the integrated-transformer circuit module. The electronic components 2595 can include active components, such as transistors, and passive components, such as resistors, capacitors, inductors, and diodes. The electronic components 2595 can provide control signals. For example, if the integrated-transformer circuit module is used in a DC-DC converter application, then the electronic components 2595 can include a control IC that regulates, for example, the power transistors in the primary side of the integrated-transformer circuit module.

Figure 26:
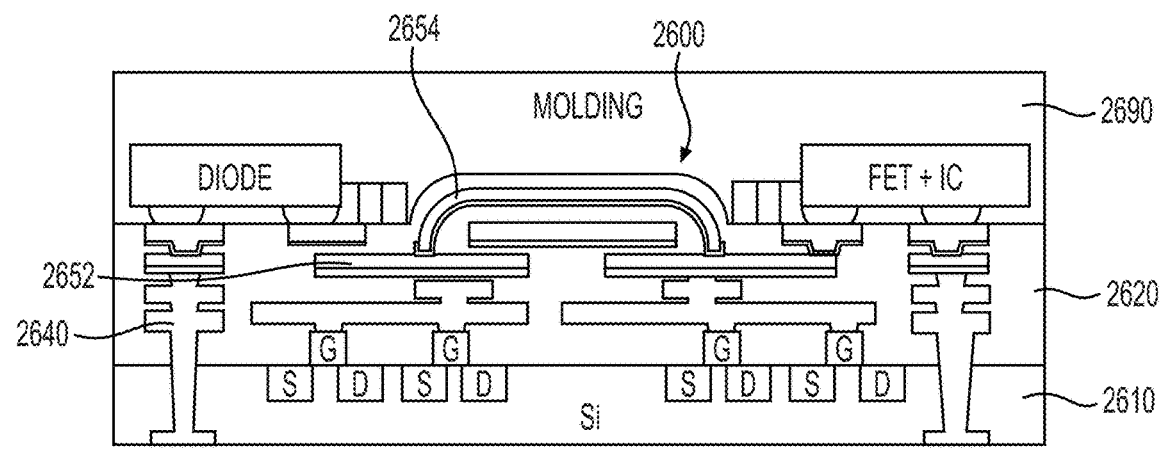
FIG. 26 shows an integrated-transformer circuit module according to another preferred embodiment of the present invention.

FIG. 26 shows a cross section of an integrated-transformer circuit module according to another preferred embodiment of the present invention. Similar to the preferred embodiment shown in FIG. 1, FIG. 26 shows that the circuit module can include a silicon substrate 2610, a transformer 2600 within an RDL that includes laminated metal layers 2640 and insulating layers 2620 on the silicon substrate 2610, and circuitry on RDL that is overmolded with a molding material 2690. However, as shown in FIG. 26, the top winding 2654 in the transformer 2600 is formed to directly contact the bottom winding 2652 without a winding connection layer. Additionally, the top winding 2654 and the insulating material covering the top winding 2654 extend above the RDL.

The metal windings of the transformer, which include top winding 2654 and bottom winding 2652, are thicker than the metal layers 2640, which allows the metal windings of the transformer to transmit higher current. For example, the thickness of the bottom winding 2652 can be about 15 μm and the thickness of the top winding 2654 can be about 15

μm or more, within manufacturing tolerances, and each metal layer 2640 can be up to about 3 μm, within manufacturing tolerances. The core of the transformer can include any of the materials previously described. The top winding 2654 can be thicker than the bottom winding 2652, which allows for the transformer to carry higher current and with more ability to dissipate heat, as compared to conventional transformers.

Although FIG. 26 shows a single cross section of the transformer 2600, it should be understood that the metal windings of the transformer includes both a primary winding connected to the primary circuit and a secondary winding connected to the secondary circuit. Instead of transformer 2600, it is possible to use an inductor, in which there is only a single winding.

FIGS. 27-45 show successive processing steps that can be used in fabricating the circuit module shown in FIG. 26. A description of features previously described may be omitted for brevity.

Figure 27:
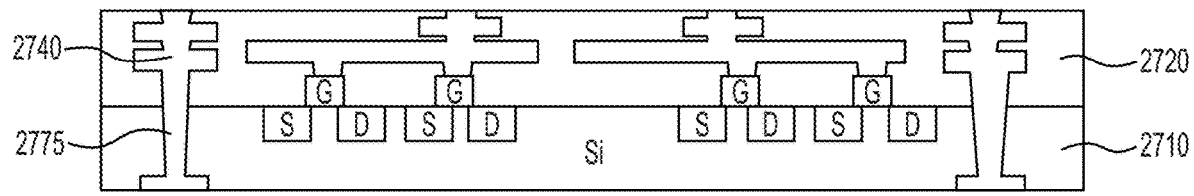
FIGS. 27-45 show processing steps included in fabricating the transformer circuit module shown in FIG. 26 according to another preferred process of the present invention.
Figure 28:
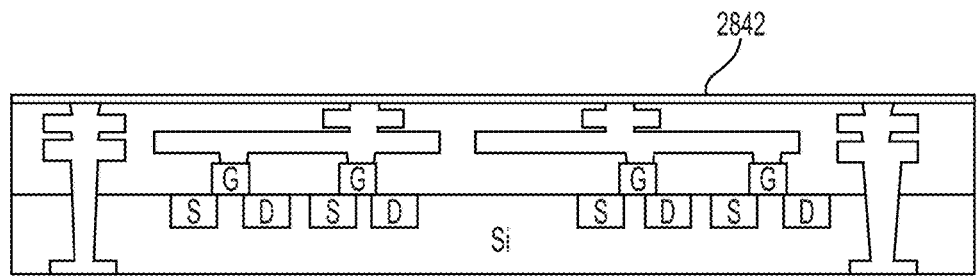
Figure 29:
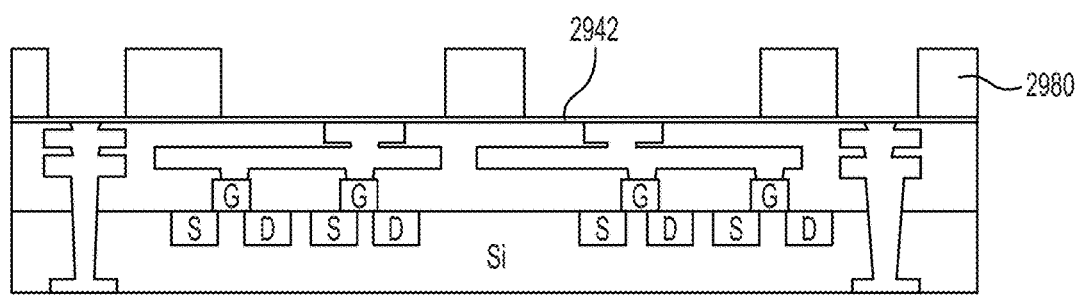

FIG. 27 shows the RDL including laminated insulating layers 2720 and metal layers 2740, and TSVs 2775 formed in and through a silicon substrate 2710 using conventional semiconductor processing techniques. FIG. 28 shows a first seed metal 2842 formed on the RDL. FIG. 29 shows a patterned resist film 2980 provided to cover a portion of the first seed metal 2942 and to expose a portion of the first seed metal 2942.

Figure 30:
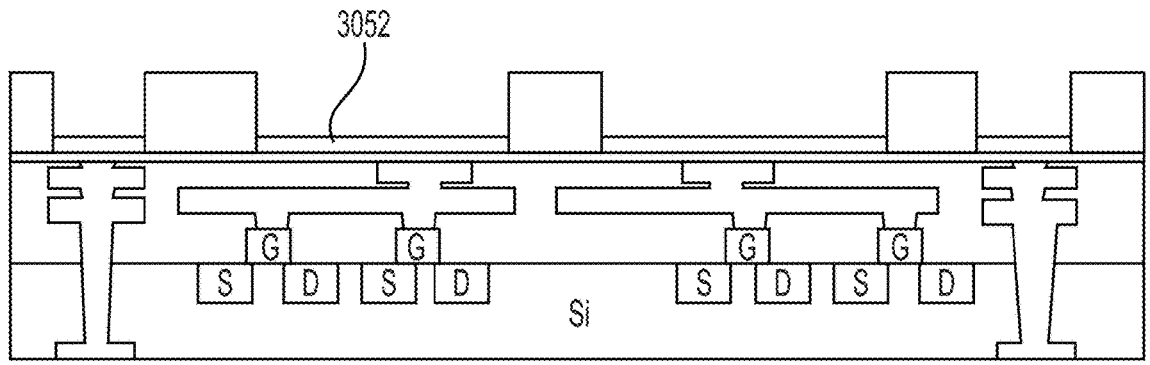
Figure 31:
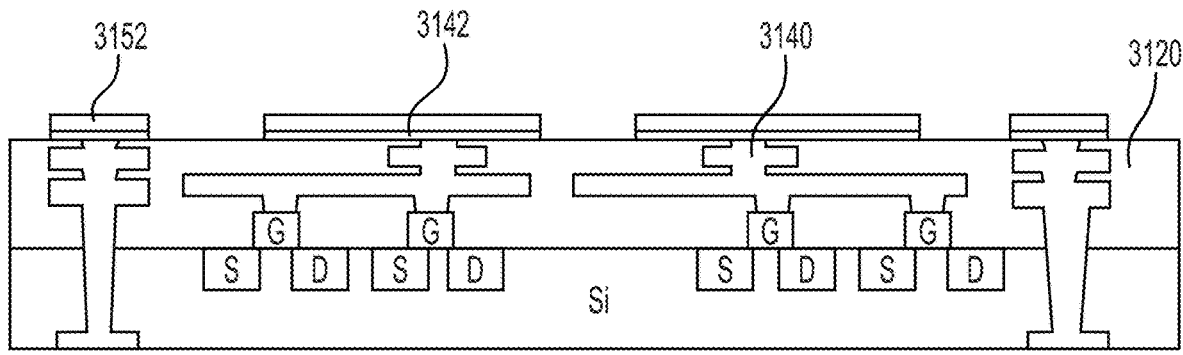
Figure 32:
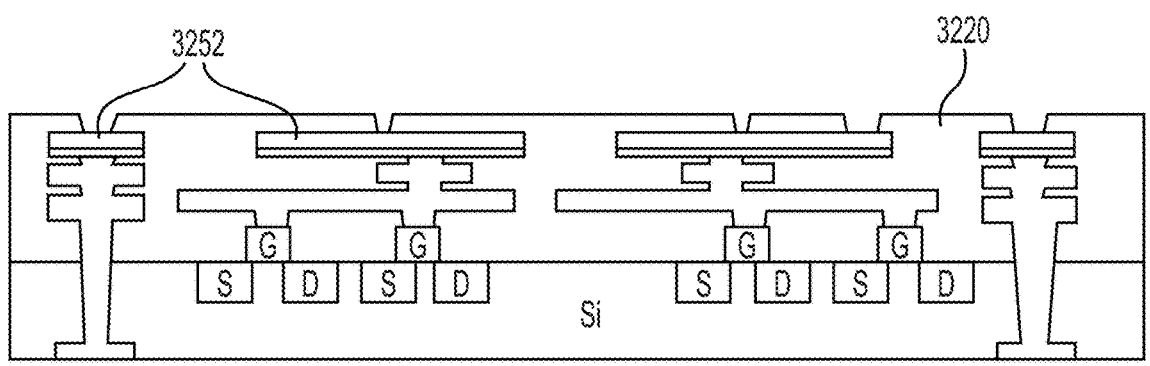

FIG. 30 shows that a bottom winding 3052 of the transformer is formed by electrolytically plating copper onto the exposed portions of the first seed metal. Although FIG. 30 shows a single cross section, it should be understood that multiple, electrically isolated bottom windings are formed. The bottom windings can be formed in a single step or multiple steps. In a transformer, some of the bottom windings define a portion of the primary winding, and some of the bottom windings define a portion of the secondary winding. In an inductor, the bottom windings define a portion of the inductor winding. In the step shown by FIG. 31, the resist film is stripped, and the first seed metal 3142 is etched, leaving the bottom winding 3152 and exposing portions of the insulating layer 3120. The portion of the winding of the transformer or inductor that is defined by the bottom winding 3152 and the remaining portion of the first seed metal 3142 is in direct contact with the top metal layer 3140 and the top insulating layer 3120. FIG. 32 shows that an insulating layer 3220 is formed on and around the bottom winding 3252 by the process described with respect to FIG. 48.

Figure 33:
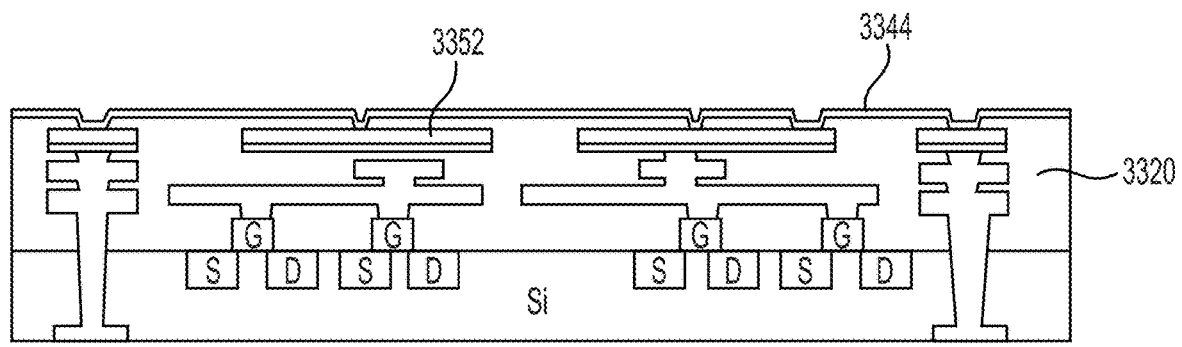
Figure 34:
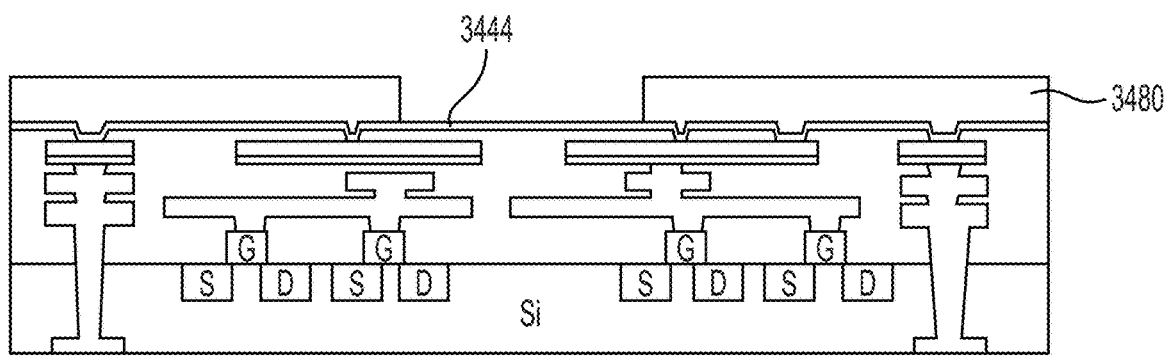
Figure 35:
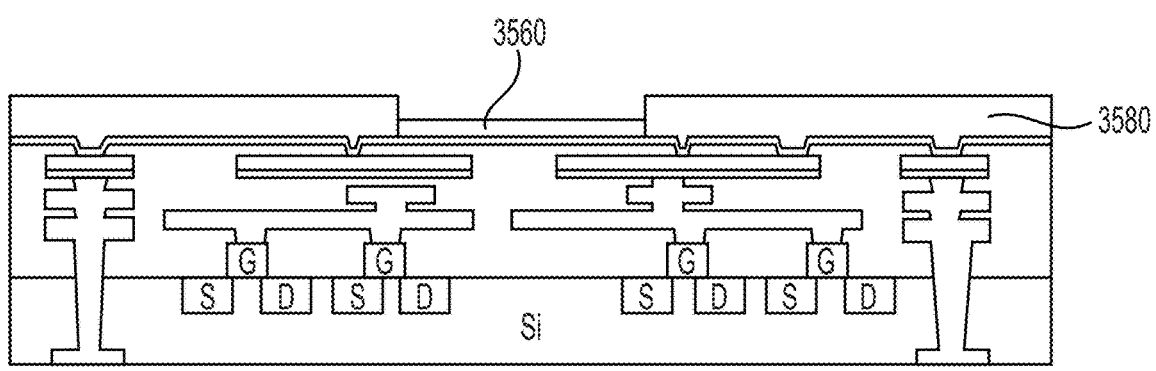

FIG. 33 shows that a second seed metal 3344 is formed on top of the insulating layer 3320 and contacting the previously exposed portions of the bottom winding 3352. FIG. 34 shows that a patterned resist film 3480 is formed on top of the second seed metal 3444, exposing a portion of the second seed metal 3444. FIG. 35 shows that a magnetic core 3560 is formed by electroplating any of the materials previously described on the portion of the second seed metal that is exposed by the resist film 3580.

Figure 36:
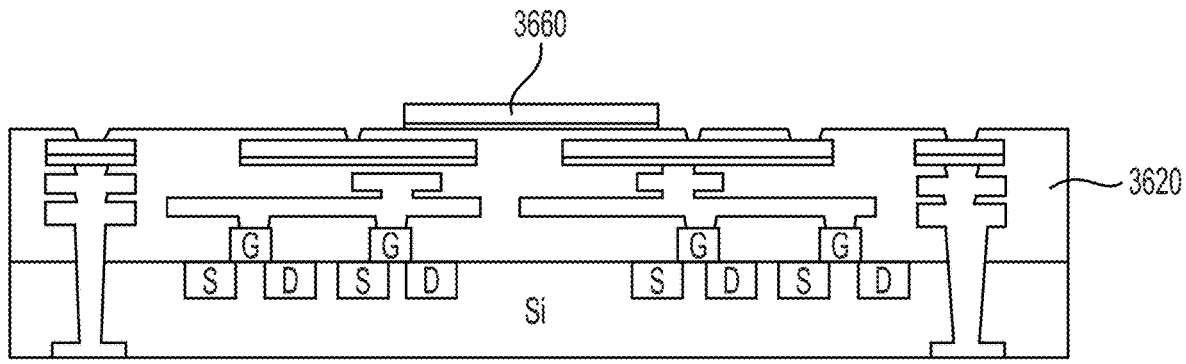
Figure 37:
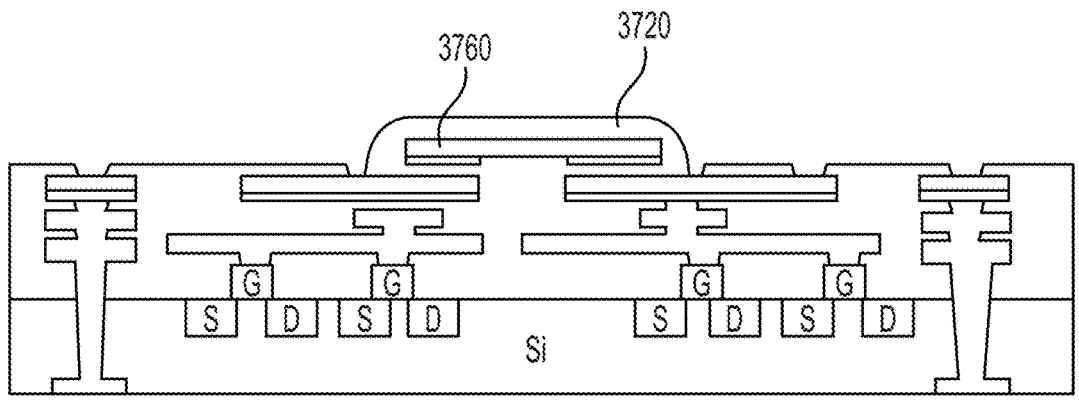
Figure 38:
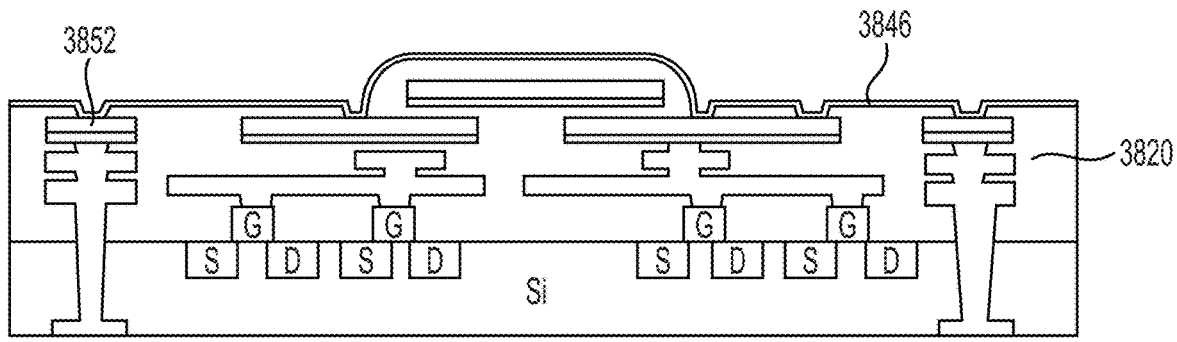

In the step shown by FIG. 36, the resist film is stripped, and the exposed second seed metal is etched away, exposing the magnetic core 3660 and the insulating layers 3620. FIG. 37 shows that an insulating layer 3720 is formed on and around the magnetic core 3760 by using the process described with respect to FIG. 48. FIG. 38 shows that a third seed metal 3846 is formed on top of the insulating layer 3820 and contacting exposed portions of the bottom winding 3852.

Figure 39:
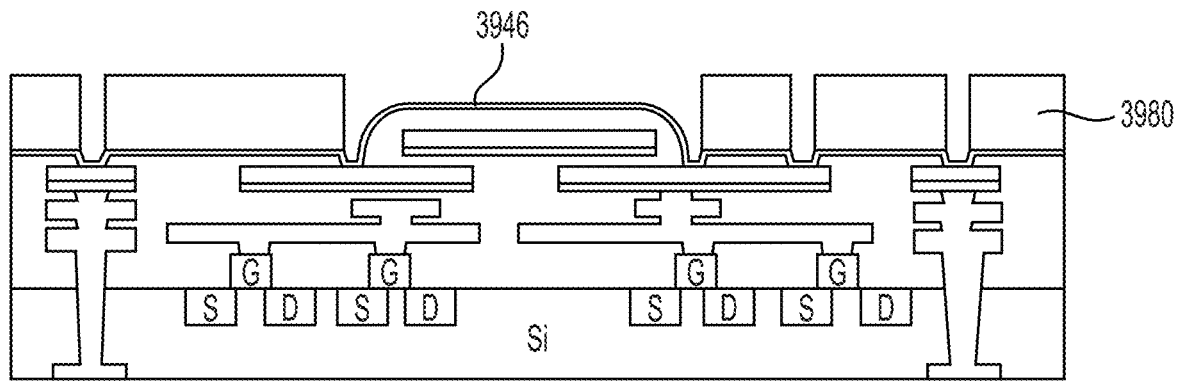
Figure 40:
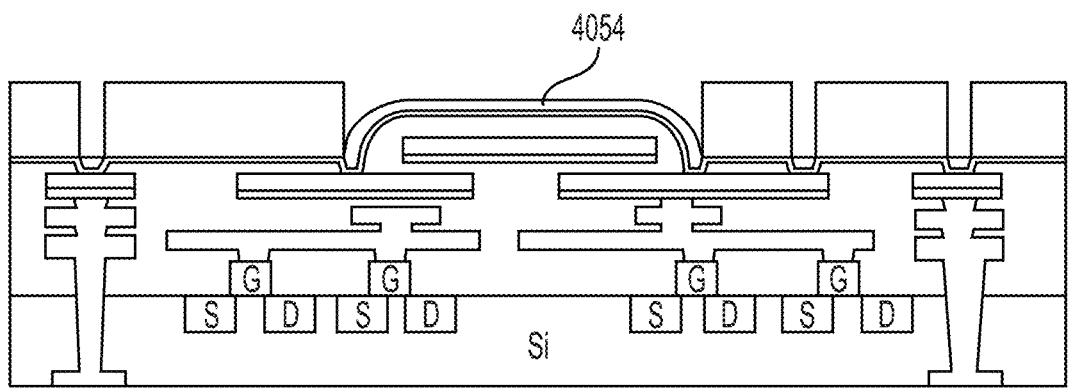
Figure 41:
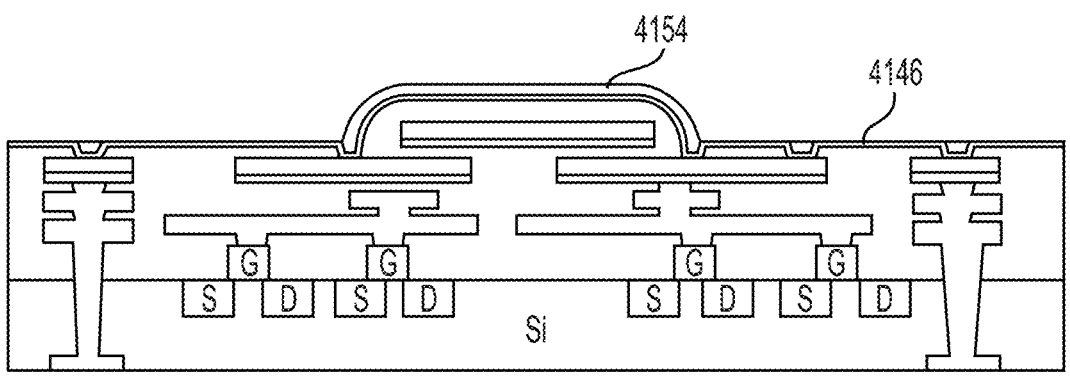

FIG. 39 shows that a patterned resist film 3980 is formed on top of the third seed metal 3946, exposing portions of the third seed metal 3946. FIG. 40 shows that a top winding 4054 of the transformer is formed by electrolytically plating copper onto the exposed portions of the third seed metal. Although FIG. 40 shows a single cross section, it should be understood that the top winding 4054 is connected to different bottom windings. Multiple top windings can be formed in a single step or in multiple steps. In a transformer, some of the top windings define a portion of the primary winding, and some of the top windings define a portion of the secondary winding. In an inductor, the top windings define a portion of the inductor winding. In the step shown by FIG. 41, the resist film is stripped exposing portions of the third seed metal 4146 and the top winding 4154.

Figure 42:
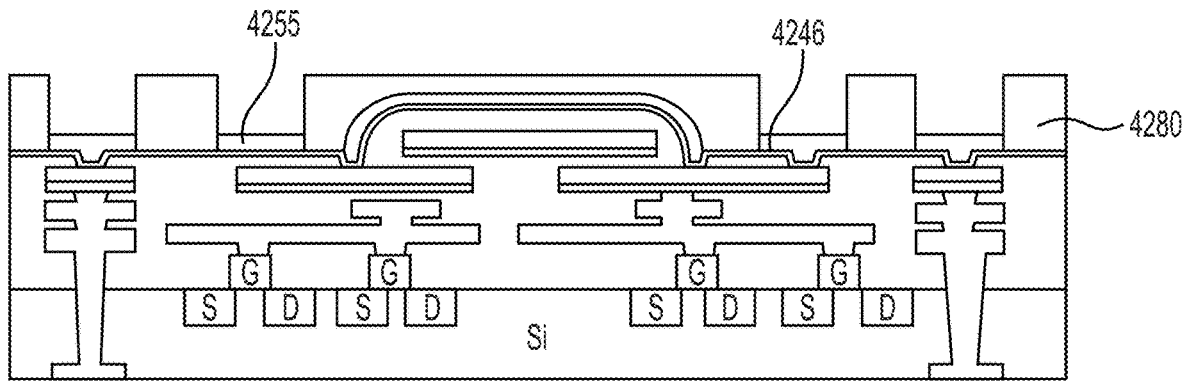
Figure 43:
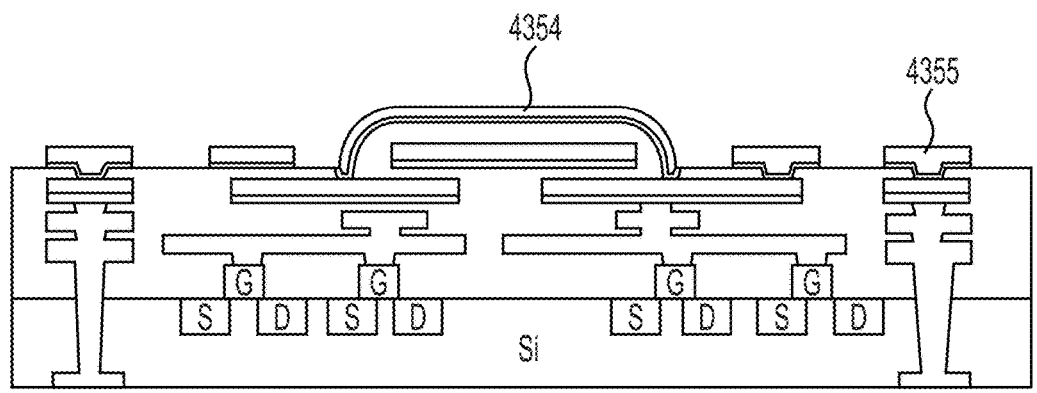
Figure 44:
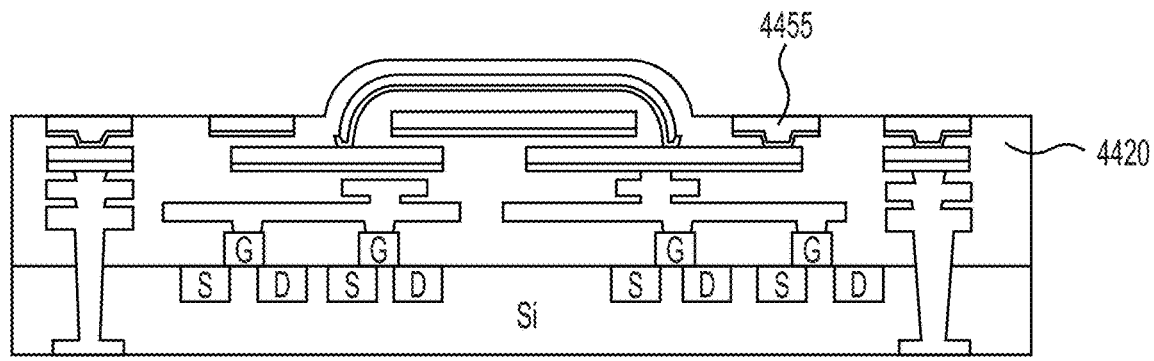

FIG. 42 shows that a patterned resist film 4280 is formed on the top winding and portions of the third seed metal 4246, exposing other portions of the third seed metal 4246, and RDL connection pads 4255 for the discrete electronic components are formed by electrolytically plating copper onto the exposed portions of the third seed metal 4246. In the step shown by FIG. 43, the resist film is stripped, and the exposed third seed metal is etched away, exposing the top winding 4354 and the RDL connection pads 4355. FIG. 44 shows that an insulating layer 4420 is formed on and around the top winding and around the RDL connection pads 4455, exposing a top surface of the RDL connection pads 4455, by patterning a resist film, heat treating the resist film, and then stripping the resist film. The entire top winding is covered by the insulating layer 4420, improving the isolation of the circuit module.

Figure 45:
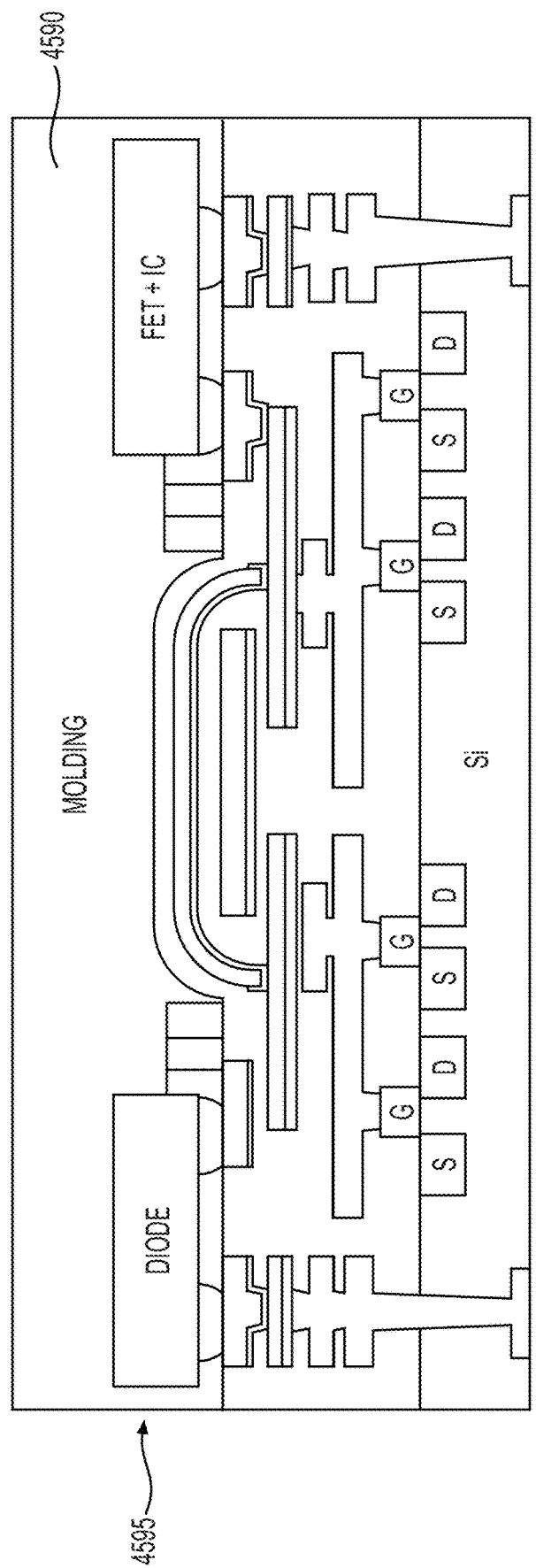

FIG. 45 shows that the circuitry and the transformer are integrated into the silicon substrate in which electronic components 4595 are connected to the RDL connection pads and then overmolded with a molding material 4590, such as a Su-8 or Novalac resin, to complete the integrated-transformer circuit module. The electronic components 4595 can include active components, such as transistors, and passive components, such as resistors, capacitors, inductors, and diodes. The electronic components 4595 can provide control signals. For example, if the integrated-transformer circuit module is used in a DC-DC converter application, then the electronic components 4595 can include a control IC that regulates, for example, the power transistors in the primary side of the integrated-transformer circuit module.

Figure 46:
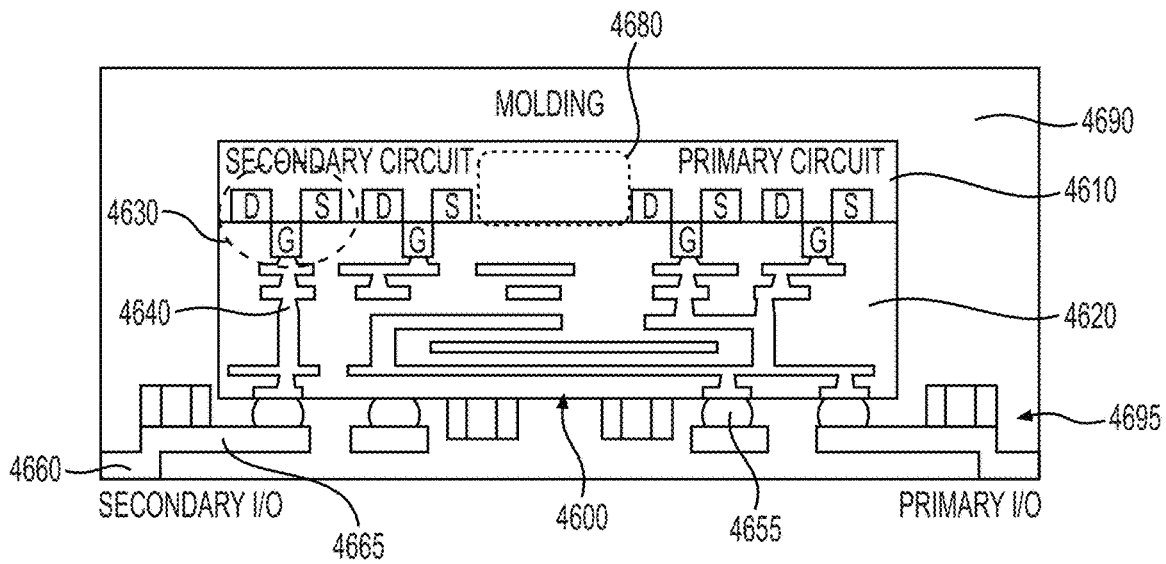
FIG. 46 shows an integrated-transformer circuit module according to another preferred embodiment of the present invention.

FIG. 46 shows an integrated-transformer circuit module according to another preferred embodiment of the present invention. FIG. 46 shows that the silicon substrate 4610 can include doped areas defining sources S and drains D and a metal layer defining gates G of transistors 4630 (within, for example, the dashed oval). The transistors 4630 can be interconnected by the metal layers 4640 within the insulating material 4620. The metal layers 4640 can be formed using typical semiconductor processing techniques.

The transformer 4600 in FIG. 46 includes plated-copper metal windings that wrap around a core and that are connected to the metal layers 4640. The metal windings of the transformer are thicker than the metal layers 4640, which allows the metal windings of the transformer to transmit higher current. For example, the thickness of the bottom winding can be about 15 μm and the thickness of the top winding can be about 15 μm or more, within manufacturing tolerances, and the thickness of each metal layer 4640 can be up to about 3 μm, within manufacturing tolerances. The core of the transformer can be made of any of the materials previously described.

Although FIG. 46 shows a single cross section of the transformer 4600, it should be understood that the metal windings of the transformer include both a primary winding connected to the primary circuit and a secondary winding connected to the secondary circuit. Instead of transformer 4600, it is possible to use an inductor, in which there is only a single winding.

FIG. 46 shows that a PN junction 4680 (within the dotted box) in the silicon substrate 4610 is used to isolate the circuitry between the primary side and the secondary side of the transformer 4600. For example, power transistors on the primary side can be defined by the transistors on the right side of FIG. 46, and synchronous rectifiers on the secondary side can be defined by the transistors on the left side of FIG. 46.

Larger discrete electronic components 4695 such as ceramic capacitors, diodes, MOSFETS, circuits on chips, etc. can be located on the RDL and connected to plated RDL connection pads of the RDL. As shown in FIG. 46, the transformer 4600 and the silicon substrate 4610 can be mounted or connected to a lead frame 4665 using solder balls 4655 or another suitable method. Optionally, discrete electronic components 4695 can be directly connected to the lead frame 4665 and/or directly connected to the bottom of the RDL.

FIG. 46 shows that the circuitry including the transformer 4600, the silicon substrate 4610, the electronic components 4695, and the lead frame 4665 are overmolded with a dielectric molding material 4690, such as a resin, to electrically isolate and to environmentally and physically protect the circuitry. Input-output (I/O) pads 4660 of the lead frame 4665 can be used to electrically interconnect the circuit module to power, control signals, external circuitry, etc. For example, the I/O pads 4660 can be used to connect the circuit module to a host substrate or PCB (not shown).

The circuit module shown in FIG. 46 can be made by a similar method as shown in FIG. 2 through FIG. 24. After the steps shown in FIG. 24, the lead frame 4665 can be connected to the RDL, and the electronic components 4695 can be connected to the lead frame 4665 and/or the RDL. Then, the circuit module can be overmolded with the dielectric molding material 4690.

It is possible that the transformer 4600 extends below the bottom surface of the RDL, similar to how the transformer 2600 extends above the top surface of the RDL in FIG. 26.

Figure 47:
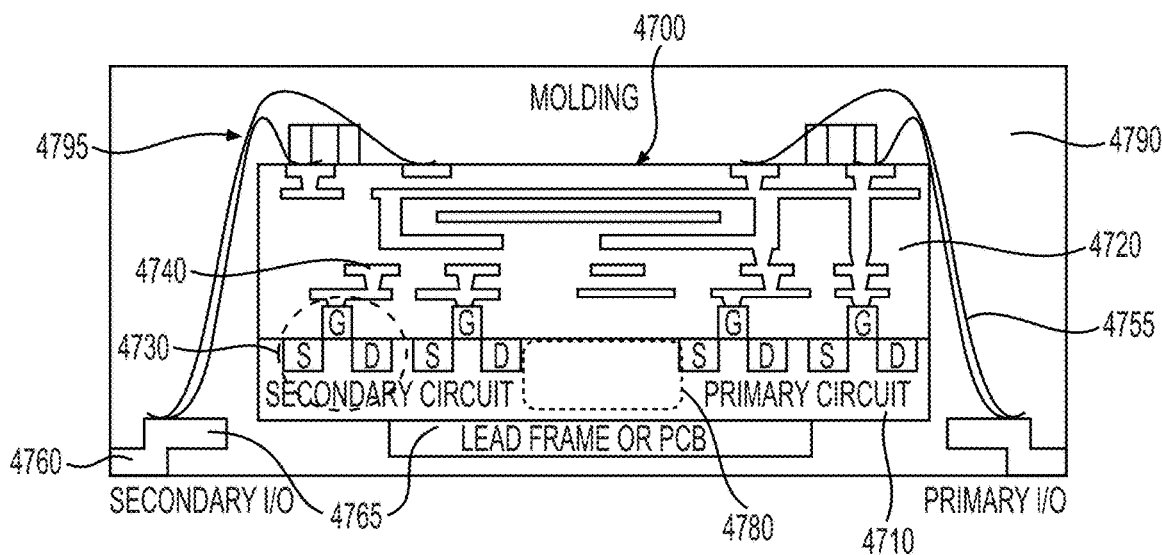
FIG. 47 shows an integrated-transformer circuit module according to another preferred embodiment of the present invention.

FIG. 47 shows an integrated-transformer circuit module according to another preferred embodiment of the present invention. FIG. 47 shows that the silicon substrate 4710 can include doped areas defining sources S and drains D and a metal layer defining gates G of transistors 4730 (within, for example, the dashed oval). The transistors 4730 can be interconnected by the metal layers 4740 within the insulating material 4720. The metal layers 4740 can be formed using typical semiconductor processing techniques.

The transformer 4700 in FIG. 47 includes plated-copper metal windings that extend around a core and that that are connected to the metal layers 4740. The metal windings of the transformer are thicker than the metal layers 4740, which allows the metal windings of the transformer to transmit higher current. For example, the thickness of the bottom winding can be about 15 μm and the thickness of the top winding can be about 15 μm or more, within manufacturing tolerances, and the thickness of each metal layer 4740 can be up to about 3 μm, within manufacturing tolerances. The core of the transformer can include any of the materials previously described.

Although FIG. 47 shows a single cross section of the transformer 4700, it should be understood that the metal windings of the transformer includes both a primary winding connected to the primary circuit and a secondary winding connected to the secondary circuit. Instead of transformer 4700, it is possible to use an inductor, in which there is only a single winding.

FIG. 47 shows that a PN junction 4780 (within the dotted box) in the silicon substrate 4710 is used to isolate the circuitry between the primary side and the secondary side of the transformer 4700. For example, power transistors on the primary side can be defined by the transistors on the right side of FIG. 47, and synchronous rectifiers on the secondary side can be defined by the transistors on the left side of FIG. 47.

Larger discrete electronic components 4795 such as ceramic capacitors, diodes, MOSFETS, circuits on chips, etc. can be located on the RDL and connected to plated RDL connection pads. As shown FIG. 47, the transformer 4700 and the silicon substrate 4710 can be mounted or connected to a lead frame 4765. The top of the RDL can be wire bonded to the lead frame 4765 using wires 4755 or another suitable method. Optionally, discrete electronic components 4795 can be connected to the top of the RDL or can be directly connected to the lead frame 4765.

FIG. 47 shows that the circuitry including the transformer 4700, the silicon substrate 4710, the electronic components 4795, the lead frame 4765, and the wires 4755 are overmolded with a dielectric molding material 4790, such as a Su-8 or Novalac resin, to electrically isolate and to environmentally and physically protect the circuitry. Input-output I/O pads 4760 of the lead frame 4765 are used to electrically interconnect the circuit module to power, control signals, external circuitry, etc. For example, the I/O pads 4760 can be used to connect the circuit module to a host substrate or PCB (not shown).

The circuit module shown in FIG. 47 can be made by a similar method as shown in FIG. 2 through FIG. 24. After the steps shown in FIG. 24, the lead frame 4765 can be connected to the silicon substrate 4710, the electronic components 4795 can be connected to the lead frame 4765 and/or the RDL, and the wire bonding can be performed to form the wires 4755. Then, the circuit module can be overmolded with the dielectric molding material 4790.

It is possible that the transformer 4700 in FIG. 47 extends above the top surface of the RDL, similar to how the transformer 2600 extends above the top surface of the RDL in FIG. 26.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:
1. A circuit module comprising:
 a redistribution layer including:
  a metal layer;
  an insulating layer; and
  a magnetic component that includes a first metal winding that extends around a core and that is connected to the metal layer;
 a substrate that is connected to a first side of the redistribution layer and that includes a first transistor and a second transistor; and an electronic component connected to a second side of the redistribution layer opposite to the first side; wherein the first metal winding is thicker than the metal layer.

2. The circuit module of claim 1, wherein the substrate includes silicon and a PN junction between the first transistor and the second transistor.

3. The circuit module of claim 1, wherein a portion of the first metal winding extends beyond a surface of the redistribution layer.

4. The circuit module of claim 1, wherein the substrate includes input-output pads that are on an opposite side of the substrate than a side of the substrate on which the redistribution layer is located.

5. The circuit module of claim 1, further comprising a lead frame connected to either the redistribution layer or the substrate.

6. The circuit module of claim 5, further comprising a wire; wherein the lead frame is connected to the substrate; and
the wire is connected to the lead frame and the redistribution layer.

7. The circuit module of claim 1, wherein the magnetic component is a transformer and further includes a second metal winding that extends around the core.

8. The circuit module of claim 7, wherein
the first transistor is connected to the first metal winding; and
the second transistor is connected to the second metal winding.

9. The circuit module of claim 7, wherein the first metal winding and the second metal winding are electrically isolated from each other.

10. The circuit module of claim 1, wherein the magnetic component is an inductor.

* * * * *